United States Patent
Leobandung

(10) Patent No.: US 9,761,698 B2
(45) Date of Patent: Sep. 12, 2017

(54) AIR GAP CONTACT FORMATION FOR REDUCING PARASITIC CAPACITANCE

(71) Applicant: INTERNATIONAL BUSINESS MACHINES CORPORATION, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/294,376

(22) Filed: Oct. 14, 2016

(65) Prior Publication Data

US 2017/0033200 A1   Feb. 2, 2017

Related U.S. Application Data

(62) Division of application No. 14/643,011, filed on Mar. 10, 2015, now Pat. No. 9,484,250.

(51) Int. Cl.
*H01L 21/764* (2006.01)
*H01L 29/66* (2006.01)
(Continued)

(52) U.S. Cl.
CPC .. *H01L 29/66795* (2013.01); *H01L 21/30604* (2013.01); *H01L 21/764* (2013.01);
(Continued)

(58) Field of Classification Search
CPC ............ H01L 21/764; H01L 21/76264; H01L 21/7682
See application file for complete search history.

(56) References Cited

U.S. PATENT DOCUMENTS 6,780,753 B2   8/2004   Latchford et al.
7,309,649 B2   12/2007   Colburn et al.
(Continued)

FOREIGN PATENT DOCUMENTS

KR   100672823 B1   1/2007

OTHER PUBLICATIONS

List of IBM Patents or Patent Applications Treated as Related dated Oct. 14, 2016, 2 pages.

(Continued)

*Primary Examiner* — Jae Lee
(74) *Attorney, Agent, or Firm* — Scully, Scott, Murphy & Pressor, P.C.; Louis J. Percello, Esq.

(57) ABSTRACT

A functional gate structure is located on a surface of a semiconductor material portion and including a U-shaped gate dielectric portion and a gate conductor portion. A source region is located on one side of the functional gate structure, and a drain region is located on another side of the functional gate structure. The source region and drain region both have a topmost surface that is above a topmost surface of the semiconductor material portion and another surface that touches a portion of the U-shaped gate dielectric. A contact structure is located on the topmost surface of the source region and/or the drain region. A middle-of-the-line air gap contact is located between the contact structure and the functional gate structure and above at least one of the source region and the drain region. The middle-of-the-line air gap contact is sealed by a portion of a conformal dielectric material.

19 Claims, 20 Drawing Sheets

(51) Int. Cl.
*H01L 21/768* (2006.01)
*H01L 29/78* (2006.01)
*H01L 29/423* (2006.01)
*H01L 29/08* (2006.01)
*H01L 23/535* (2006.01)
*H01L 21/306* (2006.01)
*H01L 23/522* (2006.01)

(52) U.S. Cl.
CPC .... *H01L 21/7682* (2013.01); *H01L 21/76895* (2013.01); *H01L 21/76897* (2013.01); *H01L 23/535* (2013.01); *H01L 29/0847* (2013.01); *H01L 29/4238* (2013.01); *H01L 29/42368* (2013.01); *H01L 29/7851* (2013.01); *H01L 23/5222* (2013.01); *H01L 2221/1063* (2013.01)

(56) References Cited

U.S. PATENT DOCUMENTS

| | | | |
|---|---|---|---|
| 7,811,924 B2 | 10/2010 | Cui et al. | |
| 7,928,003 B2 | 4/2011 | Naik | |
| 8,048,796 B2 | 11/2011 | Seidel et al. | |
| 8,264,060 B2 | 9/2012 | Braeckelmann et al. | |
| 8,421,166 B2 | 4/2013 | Chi et al. | |
| 8,536,652 B2 | 9/2013 | Lee et al. | |
| 8,575,024 B2 | 11/2013 | Li et al. | |
| 8,765,573 B2 | 7/2014 | Mallick et al. | |
| 2011/0084320 A1 | 4/2011 | Jung | |
| 2011/0147842 A1 | 6/2011 | Cappellani et al. | |
| 2013/0248950 A1* | 9/2013 | Kang | H01L 29/78 257/288 |
| 2013/0299920 A1 | 11/2013 | Yin et al. | |
| 2014/0054713 A1 | 2/2014 | Lee et al. | |
| 2014/0203348 A1 | 7/2014 | Suk et al. | |
| 2015/0035023 A1 | 2/2015 | Kim et al. | |
| 2015/0228764 A1 | 8/2015 | Zhao | |
| 2015/0348850 A1 | 12/2015 | Lee et al. | |

OTHER PUBLICATIONS

Office Action dated May 8, 2017 received in U.S. Appl. No. 15/294,391, Copy Not Enclosed.

* cited by examiner

US 9,761,698 B2

AIR GAP CONTACT FORMATION FOR REDUCING PARASITIC CAPACITANCE

BACKGROUND

The present application relates to a semiconductor structure and a method of forming the same. More particularly, the present application relates to a semiconductor structure including a middle-of-the-line (MOL) air gap contact positioned over a source/drain region that comes into contact (i.e., touches) a portion of a functional gate structure, and a method of forming such a semiconductor structure.

Field effect transistors (FETs) are the basic building block of today's integrated circuits. Such transistors can be formed in conventional bulk substrates (such as silicon) or in semiconductor-on-insulator (SOI) substrates. State of the art FETs can be fabricated utilizing a gate-first process or a gate-last process. In a gate-first process, a gate material stack is first formed, followed by the formation of source/drain regions. In a gate-last process, the source/drain regions are formed prior to replacing a sacrificial gate structure with a functional gate structure.

In either process, a gate spacer composed of a dielectric material such as, for example, silicon dioxide, is typically present on the vertical sidewalls of the functional gate structure. The presence of a gate spacer is a source of parasitic capacitance that is under the Miller effect. There have been proposal to replace conventional gate spacers with air gap spacers. However, all proposals known to date involve utilizing a sacrificial gate spacer which is formed prior to formation of the source/drain regions and then removed sometime after source/drain formation. Such a process is very difficult and is not very manufacturable.

In view of the above, there is a continued need for providing FETs in which a gate dielectric spacer is not present and which includes a method that is easy to implement and is manufacturably feasible.

SUMMARY

In one aspect of the present application, a semiconductor structure is provided that has reduced Miller capacitance. In one embodiment of the present application, the semiconductor structure includes a functional gate structure located on a surface of a semiconductor material portion and including a U-shaped gate dielectric portion and a gate conductor portion. A source region is located on one side of the functional gate structure, and a drain region is located on another side of the functional gate structure. The source region and the drain region (collectively referred to as source/drain regions) both have a topmost surface that is above a topmost surface of the semiconductor material portion and another surface that touches a portion of the U-shaped gate dielectric portion. A contact structure is located on the topmost surface of at least one of the source region and the drain region. A middle-of-the-line air gap contact is located between the contact structure and the functional gate structure and above at least one of the source region and the drain region. The middle-of-the-line air gap contact is sealed by a portion of a conformal dielectric material.

In another aspect of the present application, a method of forming a semiconductor structure having reduced Miller capacitance is provided. In one embodiment, the method includes providing a sacrificial insulator structure on a surface of a semiconductor material portion. A source region is epitaxially grown on one side of the sacrificial insulator structure and a drain region is epitaxially grown on another side of the sacrificial insulator structure. Both the source region and the drain region have a topmost surface that is above a topmost surface of the semiconductor material portion. The sacrificial insulator structure is then replaced with a functional gate structure. The functional gate structure comprises a U-shaped gate dielectric portion and a gate conductor portion. In accordance with the present application, another surface of both the source region and the drain region touches a portion of the U-shaped gate dielectric portion. A sacrificial contact material portion is then formed within a contact opening and along a vertical sidewall of the functional gate structure. Next, a contact structure is formed on the topmost surface of at least one of the source region and the drain region. The sacrificial contact material portion is then removed, and thereafter a middle-of the-line air gap contact is formed within a portion of a volume previously occupied by the sacrificial contact material portion.

DETAILED DESCRIPTION

Figure 1A:
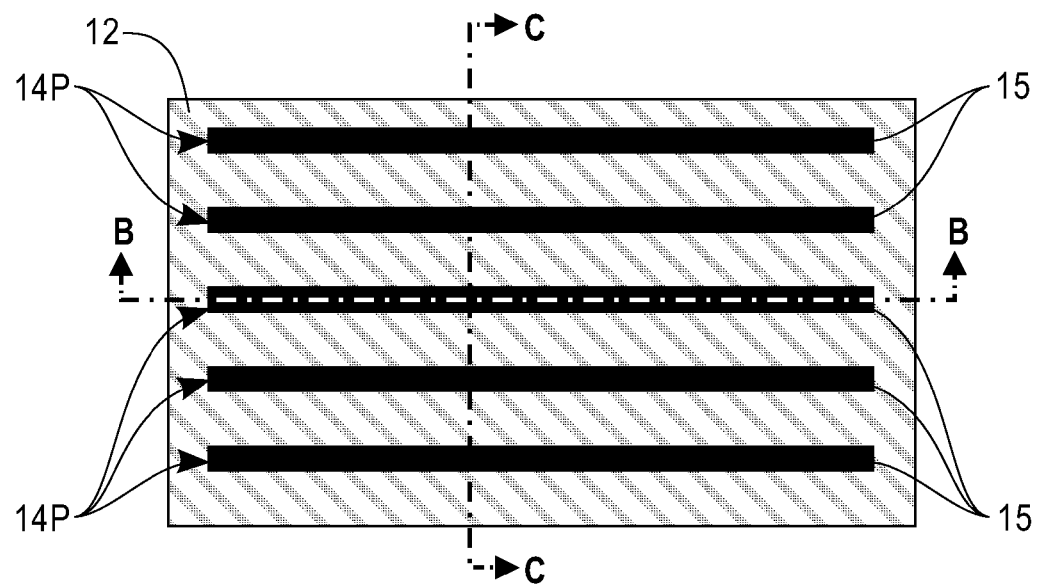
FIG. 1A is a top down view of an exemplary semiconductor structure including a plurality of semiconductor material portions located on a surface of a substrate in accordance with one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
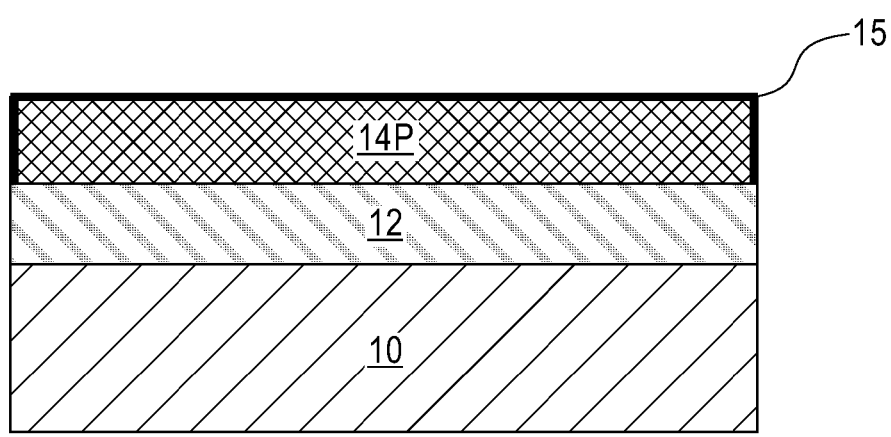
FIG. 1B is a vertical cross sectional view of the exemplary semiconductor structure along vertical plane B-B of FIG. 1A.
Figure 1C:
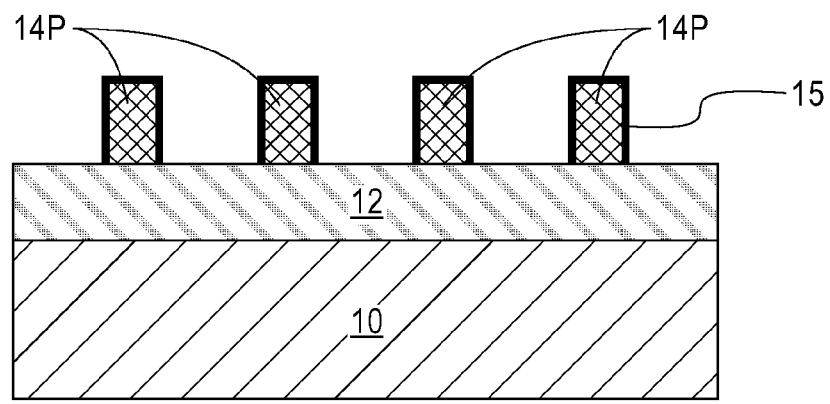
FIG. 1C is a vertical cross sectional view of the exemplary semiconductor structure along vertical plane C-C of FIG. 1A.
Figure 2A:
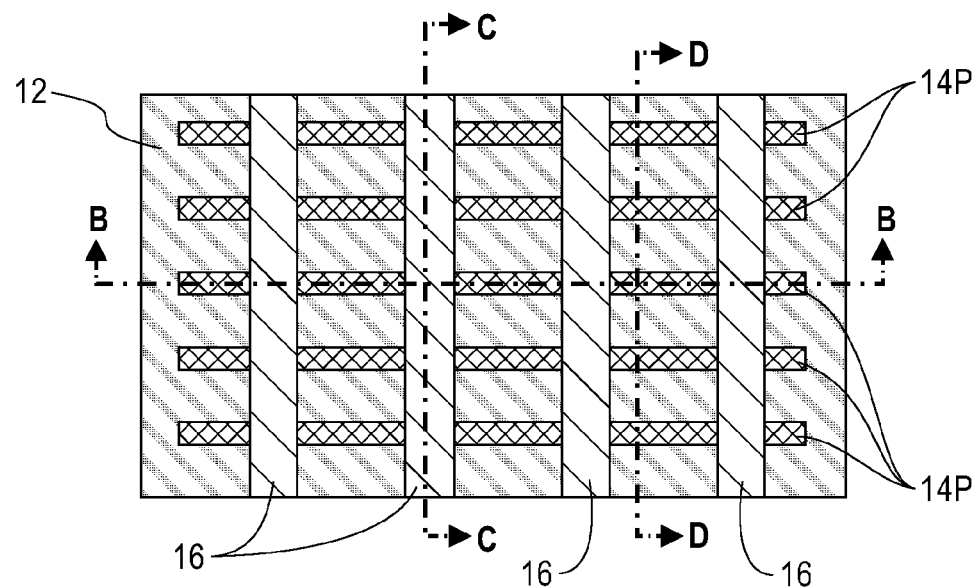
FIG. 2A is a top down view of the exemplary semiconductor structure of FIG. 1A after forming a plurality of sacrificial insulator structures straddling over each semiconductor material portion and located on the surface of the substrate.
Figure 2B:
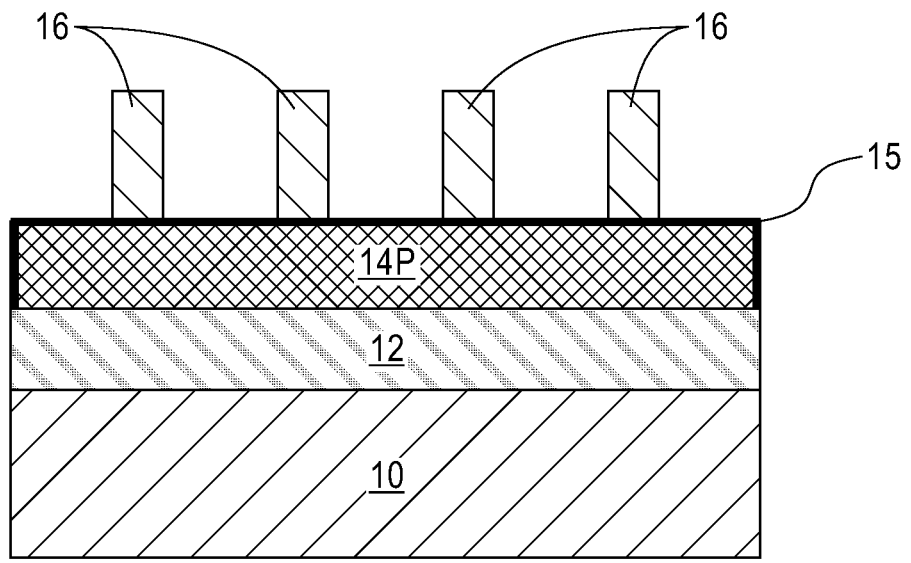
FIG. 2B is a vertical cross sectional view of the exemplary semiconductor structure along vertical plane B-B of FIG. 2A.
Figure 2C:
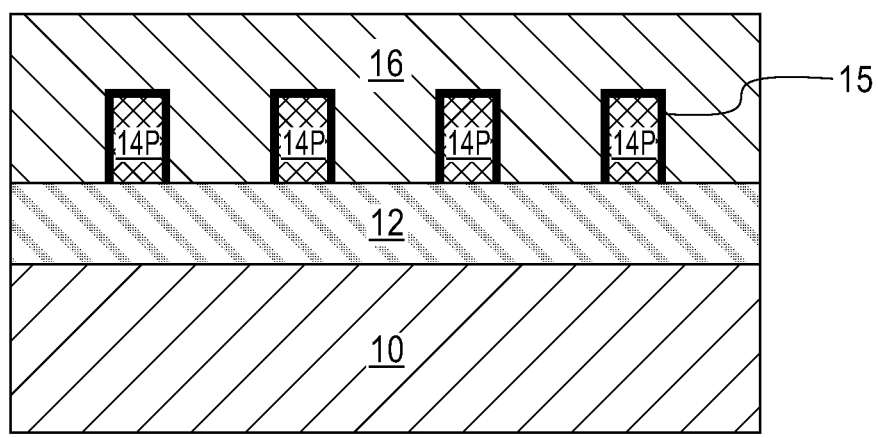
FIG. 2C is a vertical cross sectional view of the exemplary semiconductor structure along vertical plane C-C of FIG. 2A.
Figure 2D:
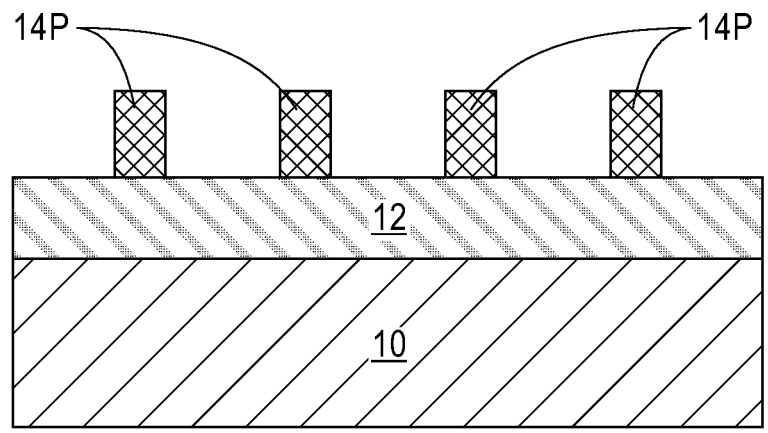
FIG. 2D is a vertical cross sectional view of the exemplary semiconductor structure along vertical plane D-D of FIG. 2A.
Figure 3A:
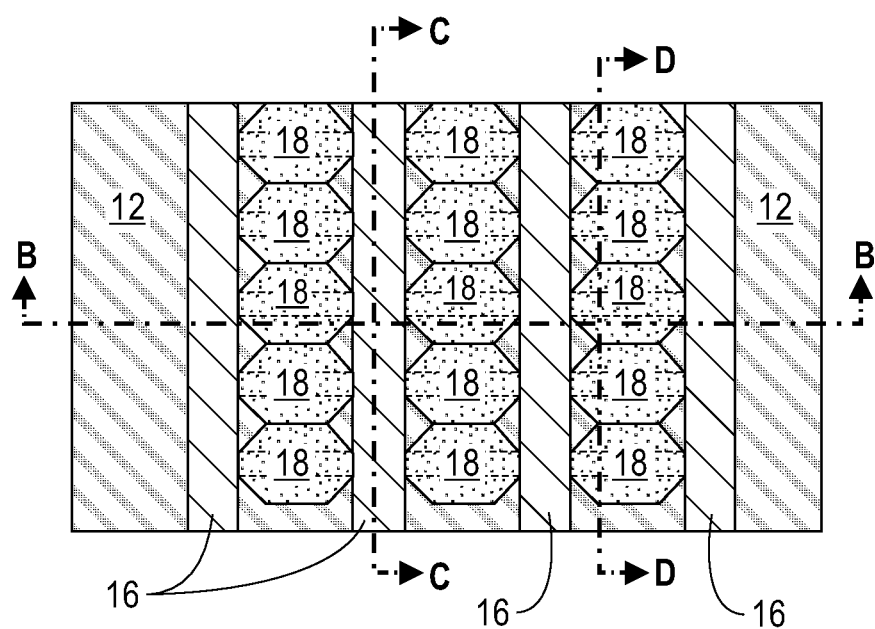
FIG. 3A is a top down view of the exemplary semiconductor structure of FIG. 2A after forming source/drain regions on portions of each semiconductor material portion not protected by a sacrificial insulator structure.
Figure 3B:
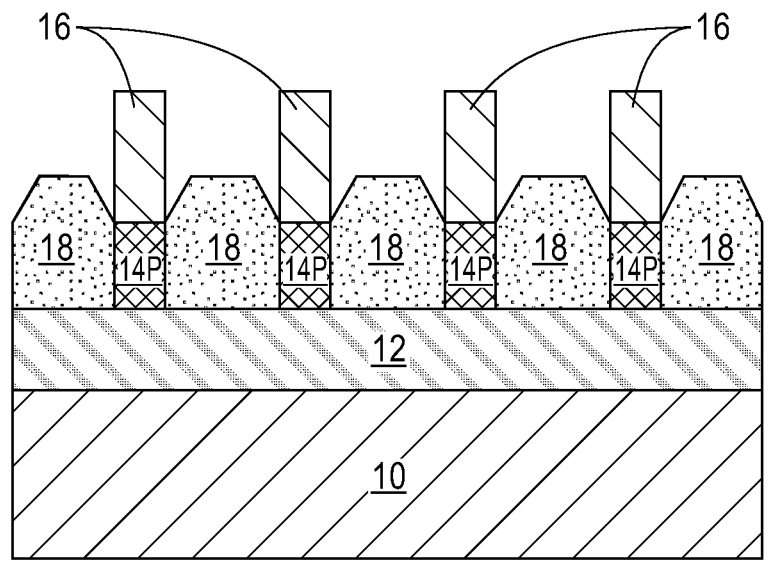
FIG. 3B is a vertical cross sectional view of the exemplary semiconductor structure along vertical plane B-B of FIG. 3A.
Figure 3C:
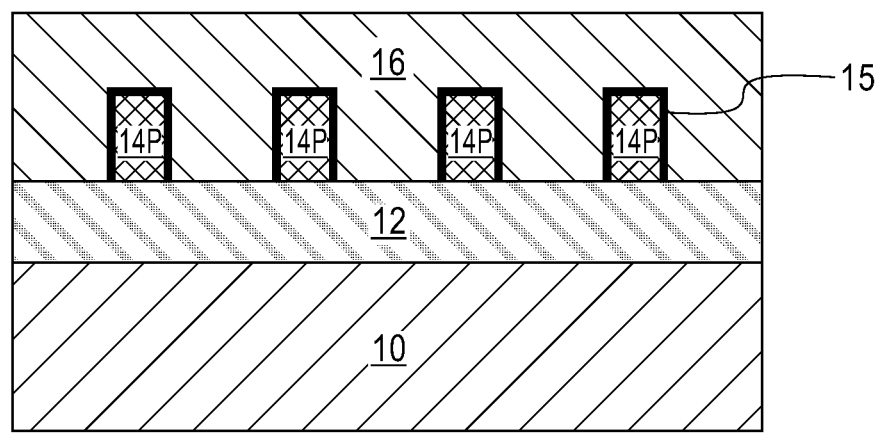
FIG. 3C is a vertical cross sectional view of the exemplary semiconductor structure along vertical plane C-C of FIG. 3A.
Figure 3D:
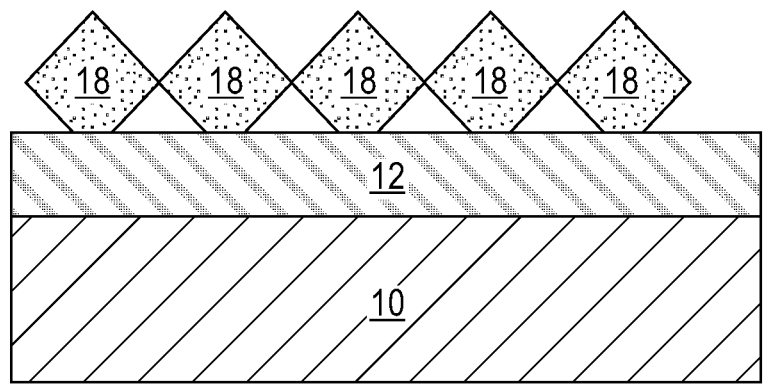
FIG. 3D is a vertical cross sectional view of the exemplary semiconductor structure along vertical plane D-D of FIG. 3A.
Figure 4A:
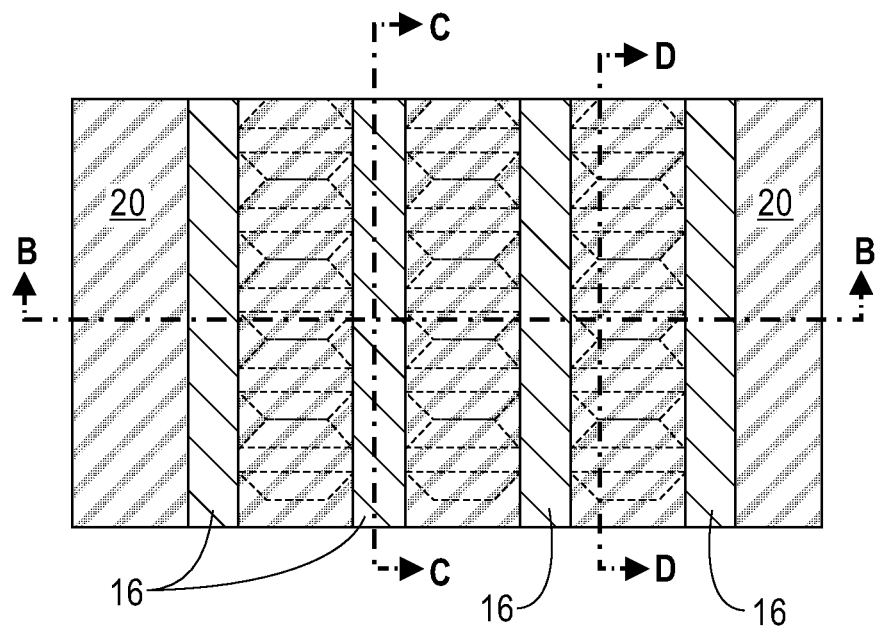
FIG. 4A is a top down view of the exemplary semiconductor structure of FIG. 3A after forming a planarizing dielectric material having a topmost surface that is coplanar with a topmost surface of each sacrificial insulator structure.
Figure 4B:
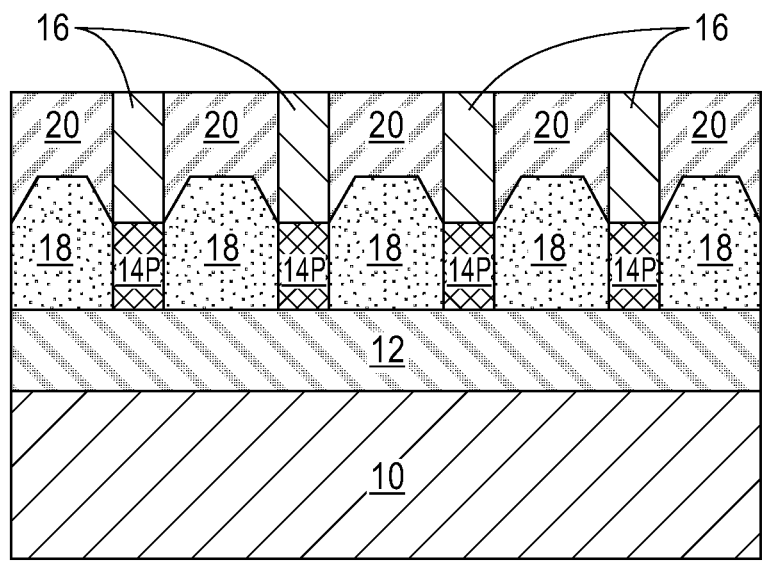
FIG. 4B is a vertical cross sectional view of the exemplary semiconductor structure along vertical plane B-B of FIG. 4A.
Figure 4C:
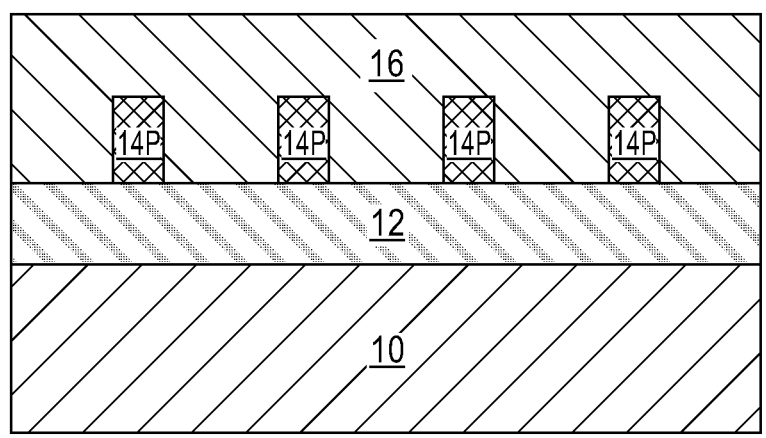
FIG. 4C is a vertical cross sectional view of the exemplary semiconductor structure along vertical plane C-C of FIG. 4A.
Figure 4D:
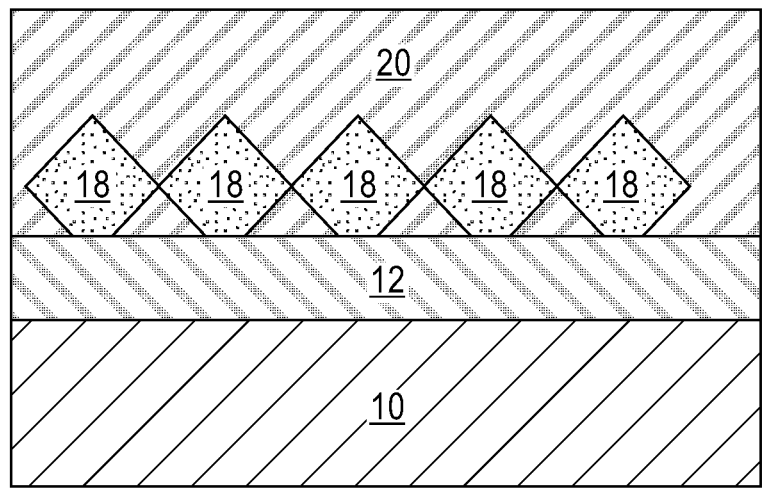
FIG. 4D is a vertical cross sectional view of the exemplary semiconductor structure along vertical plane D-D of FIG. 4A.
Figure 5A:
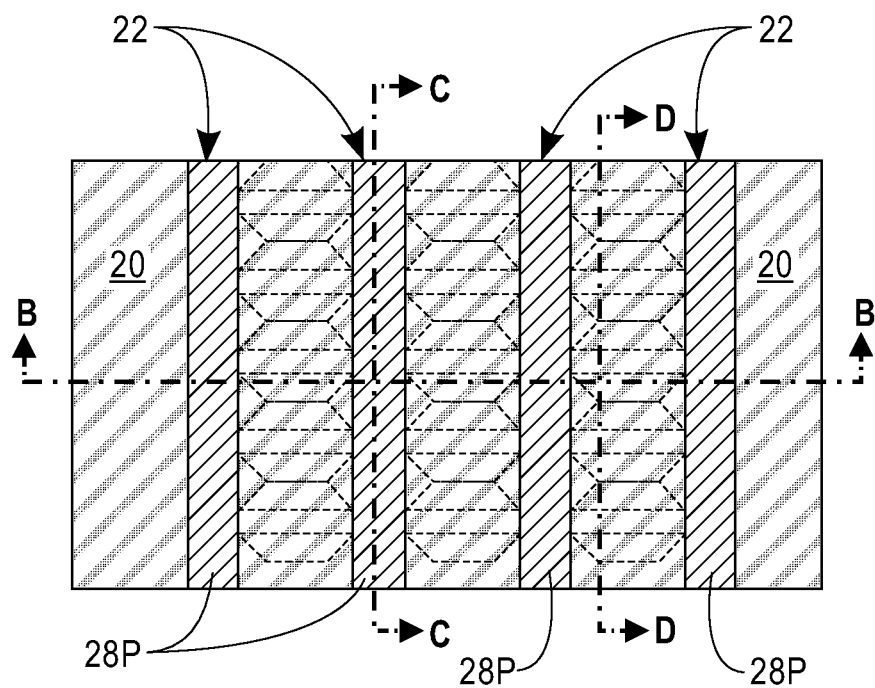
FIG. 5A is a top down view of the exemplary semiconductor structure of FIG. 4A after replacing each sacrificial insulator structure with a functional gate structure.
Figure 5B:
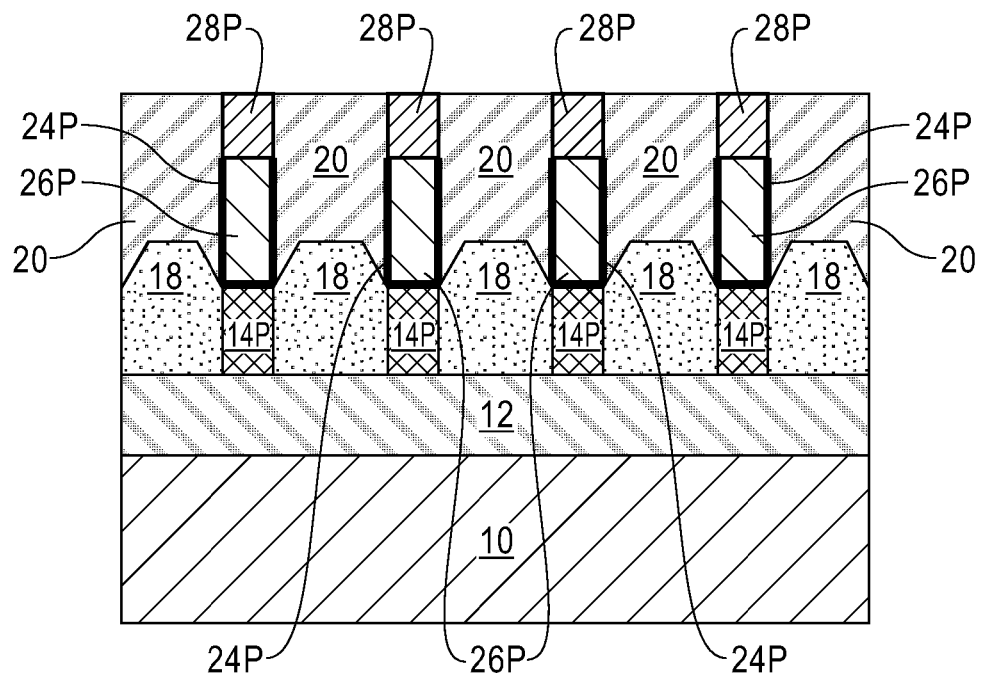
FIG. 5B is a vertical cross sectional view of the exemplary semiconductor structure along vertical plane B-B of FIG. 5A.
Figure 5C:
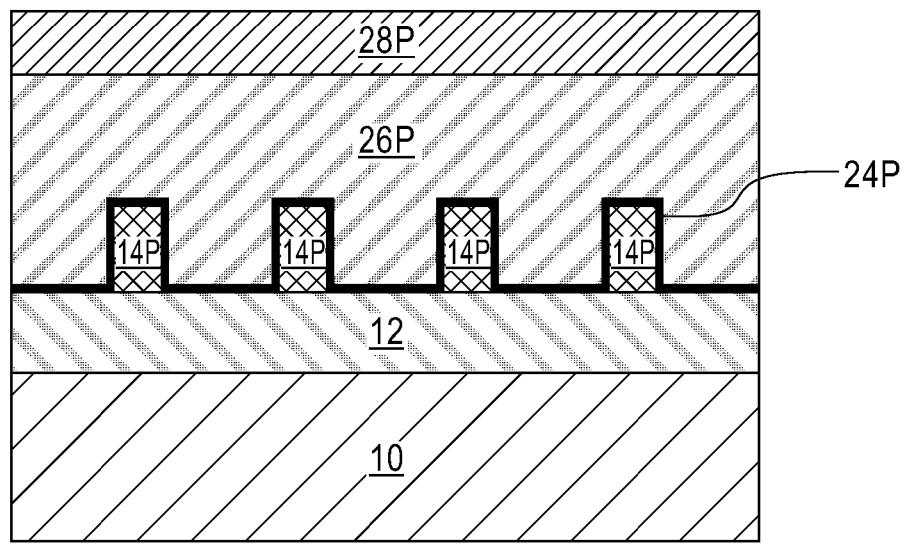
FIG. 5C is a vertical cross sectional view of the exemplary semiconductor structure along vertical plane C-C of FIG. 5A.
Figure 5D:
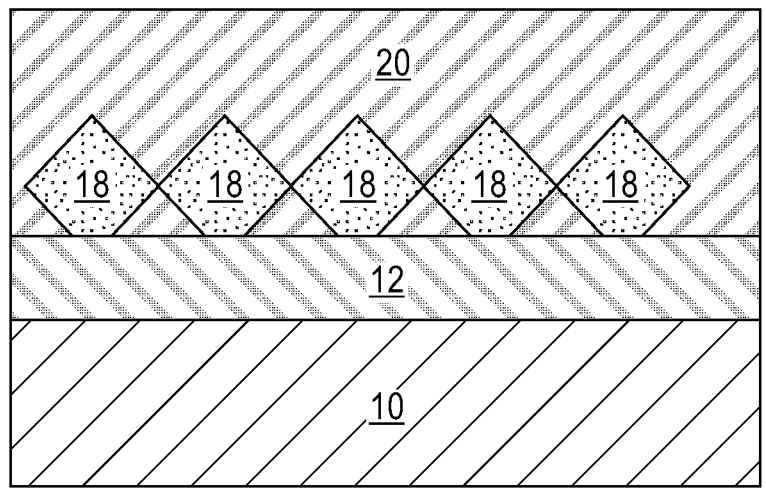
FIG. 5D is a vertical cross sectional view of the exemplary semiconductor structure along vertical plane D-D of FIG. 5A.

Referring first to FIGS. 1A-1C, there are illustrated various views of an exemplary semiconductor structure including a plurality of semiconductor material portions 14P located on a surface of a substrate in accordance with one embodiment of the present application. Although a plurality of semiconductor material portions 14P is described and illustrated, the present application contemplates embodiments in which a single semiconductor material portion 14P is formed.

In some embodiments of the present application, and as illustrated in the drawings of the present application, each semiconductor material portion 14P of the plurality of semiconductor material portions is a semiconductor fin. In such an embodiment, and as shown, each semiconductor material portion 14P is orientated parallel to each other. In another embodiment of the present application (not shown), each semiconductor material portion 14P of the plurality of semiconductor material portions is a semiconductor nanowire whose ends are attached to a corresponding semiconductor material pad region. In yet another embodiment (also not shown), each semiconductor material portion 14P may represent a semiconductor active device region of a planar semiconductor substrate. In such an embodiment, each semiconductor active device region is separated by a trench isolation structure (not shown) as is well known to those skilled in the art.

In one embodiment of the present application, and as shown, the substrate comprises, from bottom to top, a handle substrate 10 and an insulator layer 14. In yet another embodiment (not shown), the substrate comprises a remaining portion of a bulk semiconductor substrate. The term "bulk" when used in conjunction with the phrase "semiconductor substrate" denotes that the entire substrate is composed of at least one semiconductor material.

The exemplary semiconductor structure shown in FIGS. 1A-1C can be formed by first providing a bulk semiconductor substrate or a semiconductor-on-insulator (SOI) substrate. When a bulk semiconductor substrate is employed in the present application, the at least one semiconductor material that provides the bulk semiconductor substrate can include, but is not limited to, Si, Ge, SiGe, SiC, SiGeC, III/V compound semiconductors such as, for example, InAs, InP, InAsP, and GaAs, and II/VI compound semiconductor materials. In such an embodiment, a topmost semiconductor material layer portion of the bulk semiconductor substrate can be used as each semiconductor material portion 14P, while the remaining portion of the bulk semiconductor substrate can be used as the substrate. In some embodiments of the present application, the bulk semiconductor substrate may be a single crystalline semiconductor material. In other embodiments of the present application, the bulk semiconductor substrate may be a polycrystalline semiconductor material or an amorphous semiconductor material. The crystal orientation of the bulk semiconductor substrate may be {100}, {110}, or {111}. Other crystallographic orientations besides those specifically mentioned can also be used in the present application.

When an SOI substrate is employed, the SOI substrate includes from, bottom to top, the handle substrate 10, the insulator layer 12, and a topmost semiconductor layer. The topmost semiconductor layer of the SOI substrate will provide each semiconductor material portion 14P of the structure shown in FIGS. 1A-1C. In some embodiments of the present application, the handle substrate 10 and the topmost semiconductor layer of the SOI substrate may comprise a same semiconductor material. In other embodiments of the present application, the handle substrate 10 and the topmost semiconductor layer of the SOI substrate may comprise a different semiconductor material. The semiconductor material(s) that can be used as the handle substrate 10 and the topmost semiconductor layer include one of the semiconductor materials mentioned above for the bulk semiconductor substrate. In one embodiment, the handle substrate 10 and the topmost semiconductor layer of the SOI substrate are both comprised silicon. In some embodiments, the handle substrate 10 is a non-semiconductor material including, for example, a dielectric material and/or a conductive material.

The handle substrate 10 and the topmost semiconductor layer of the SOI substrate may have the same or different crystal orientation including any of those mentioned above for the bulk semiconductor substrate. The handle substrate 10 and/or the topmost semiconductor layer of the SOI substrate may be a single crystalline semiconductor material, a polycrystalline material, or an amorphous material. Typically, at least the topmost semiconductor layer of the SOI substrate is a single crystalline semiconductor material.

The insulator layer 12 of the SOI substrate may be a crystalline or non-crystalline oxide or nitride. In one embodiment, the insulator layer 12 is an oxide such as, for example, silicon dioxide.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of topmost semiconductor layer of the SOI substrate is typically from 10 nm to 100 nm, although other thicknesses that are lesser than, or greater than, the aforementioned thickness range may also be used for the thickness of the topmost semiconductor layer of the SOI substrate. The insulator layer 12 of the SOI substrate typically has a thickness from 1 nm to 200 nm, although other thicknesses that are lesser than, or greater than, the aforementioned thickness range for the insulator layer 12 of the SOI substrate can be used. The thickness of the handle substrate 10 of the SOI substrate is inconsequential to the present application.

In some embodiments of the present application, a hard mask layer (not shown) can be formed on a topmost surface of either the bulk semiconductor substrate or the SOI substrate. The hard mask layer that can be employed is a contiguous layer that covers the entirety of the topmost surface of the bulk semiconductor substrate or the SOI substrate. The hard mask layer that can be employed in the present application may include a semiconductor oxide, a semiconductor nitride and/or a semiconductor oxynitride. In one embodiment, the hard mask material that can be used in providing the hard mask layer can be comprised of silicon dioxide. In another embodiment, the hard mask material that can be used in providing the hard mask layer can be comprised of silicon nitride. In yet another embodiment, the hard mask material that can be used in providing the hard mask layer can be a stack comprised of, in any order, silicon dioxide and silicon nitride.

In some embodiments of the present application, the hard mask material that can be used in providing the hard mask layer can be formed by a deposition process such as, for example, chemical vapor deposition (CVD) or plasma enhanced chemical vapor deposition (PECVD). In other embodiments, the hard mask material that can be used in providing the hard mask layer can be formed by a thermal process such as, for example, thermal oxidation and/or thermal nitridation. In yet other embodiments, the hard mask material that can be used in providing the hard mask layer can be formed by a combination of a deposition process and a thermal process. The thickness of the hard mask material that can be used in providing the hard mask layer can range from 2 nm to 10 nm, although other thickness that are lesser than, or greater, than the aforementioned thickness range can be used for the hard mask layer.

Next, the bulk semiconductor substrate or the SOI substrate, with or without the hard mask layer, can be patterned to provide the semiconductor material portions 14P shown in FIGS. 1A-1C. In embodiments in which the semiconductor material portions 14P are not semiconductor fins, this patterning step can be used to form isolation trenches within the bulk semiconductor substrate or SOI substrate, which are thereafter, processed into trench isolation structures.

In one embodiment, the patterning process used to define the semiconductor material portions 14P may include a sidewall image transfer (SIT) process. The SIT process includes forming a contiguous mandrel material layer (not shown) on the topmost surface of the hard mask layer, the bulk semiconductor substrate or the SOI substrate. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu, a semiconductor material such as, for example, silicon, or insulator such as, for example, silicon dioxide, or silicon nitride. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown).

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching. Since the dielectric spacers are used in the SIT process as an etch mask, the width of the each dielectric spacer can be used to determine the width of each semiconductor material portion 14P.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the semiconductor material that provides each semiconductor material portion 14P. The pattern transfer may be achieved by an etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In some embodiments, lithography and etching can be used to define the each semiconductor material portion 14P. In some embodiments and following formation of the semiconductor material portions 14P, the hard mask material can be removed from atop the semiconductor material portions 14P by a planarization process or by etching.

As mentioned above, each semiconductor material portion 14P can be a semiconductor fin. As used herein, a "semiconductor fin" refers to a contiguous semiconductor structure that extends upward from a surface of a substrate. In one embodiment, the substrate includes insulator layer 12 and handle substrate 10. In other embodiments, the substrate is a remaining portion of a bulk semiconductor substrate. Each fin structure that is formed includes a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor material portion 14P has a width from 4 nm to 30 nm. In another embodiment of the present application, each semiconductor material portion 14P has a width from 5 nm to 12 nm.

In some embodiments and as shown in FIGS. 1A-1C, a protective dielectric coating 15 can be formed on exposed surfaces (top and sidewall surfaces) of each semiconductor material portion 14P; in FIG. 1A the shape of the semiconductor material portion 14P is shown for clarity. In one embodiment, the protective dielectric coating 15 includes an oxide such as, for example, silicon dioxide. Other dielectric materials may also be used as the material of the protective dielectric coating 15. In some embodiments, the protective dielectric coating 15 comprises a same dielectric material as insulator layer 12. In other embodiments, the protective dielectric coating 15 may comprise a different dielectric material than insulator layer 12. In yet other embodiments, the formation of a protective dielectric coating 15 can be omitted. In one embodiment, the protective dielectric coating 15 can be formed by a deposition process such as, for example, chemical vapor deposition or plasma enhanced chemical vapor deposition. In another embodiment, the protective dielectric coating 15 can be formed by a thermal process such as, for example, thermal oxidation. In one embodiment of the present application, the protective dielectric coating 15 has a thickness from 1 nm 5 nm. Other thicknesses that are lesser than, or greater than, the aforementioned thickness range may also be used as the thickness of protective dielectric coating 15.

Referring now to FIGS. 2A-2D, there are illustrated various views of the exemplary semiconductor structure of FIGS. 1A-1C after forming a plurality of sacrificial insulator structures 16 straddling over each semiconductor material portion 14P and located on the surface of the substrate (10, 12). For clarity, the protective dielectric coating 15 is not shown in the top down view of FIG. 2A. Each sacrificial insulator structure 16 that is formed serves as a placeholder material for a functional gate structure to be subsequently formed. Although a plurality of sacrificial insulator structures 16 are disclosed and illustrated, the present application works for embodiments in which a single sacrificial insulator structure is formed.

The term "straddling" denotes that each sacrificial insulator structure 16 is formed across a semiconductor material portion 14P such that a first portion of each sacrificial insulator structure 16 is present on one side of the semiconductor material portion 14P, and a second portion of each sacrificial insulator structure 16 is present on another side of the semiconductor material portion 14P. In the illustrated embodiment, each sacrificial insulator structure 16 lies perpendicular to each semiconductor material portion 14P.

In some embodiments (not shown), and when the semiconductor material portions represent a semiconductor active device region of a planar semiconductor substrate, each sacrificial insulator structure 16 is present on a topmost planar semiconductor material surface within the semiconductor active device region.

Each sacrificial insulator structure 16 that is formed comprises a dielectric material that differs from the dielectric material that provides protective dielectric coating 15 and/or different from the dielectric material that provides insulator layer 12. As such, each sacrificial insulator structure 16 has a different etch rate than protective dielectric coating 15 and/or insulator layer 12. In one example, and when the protective dielectric coating 15 and the insulator layer 12 are both comprised of silicon dioxide, each sacrificial insulator structure 16 is comprised of silicon nitride.

Each sacrificial insulator structure 16 is formed by first providing a blanket layer of a dielectric material. The blanket layer of dielectric material that provides each sacrificial insulator structure 16 can be formed utilizing a deposition process such as, for example, chemical vapor deposition, plasma enhanced chemical vapor deposition, or physical vapor deposition. The blanket layer of dielectric material that provides each sacrificial insulator structure 16 may have a thickness from 25 nm to 200 nm. Other thicknesses that are lesser than, or greater than, the aforementioned thickness range can also be used as the thickness of the blanket layer of dielectric material that provides each sacrificial insulator structure 16. After providing the blanket layer of dielectric material, the blanket layer of dielectric material is patterned to provide each sacrificial insulator structure 16. In one embodiment of the present application, the patterning of the blanket layer of dielectric material may include lithography and etching (as defined above). In another embodiment of the present application, the patterning of the blanket layer of dielectric material may include a sidewall image transfer process (as also defined above).

Each sacrificial insulator structure 16 has a height which is within the thickness range mentioned above for the blanket layer of dielectric material (i.e., 25 nm to 200 nm). Each sacrificial insulator structure 16 has a width, as measured from one vertical sidewall surface to an opposing sidewall surface, of from 5 nm to 200 nm. Other widths that are lesser than, or greater than, the aforementioned width range may also be used as the width of each sacrificial insulator structure 16.

Referring now to FIGS. 3A-3D, there are illustrated various views of the exemplary semiconductor structure of FIGS. 2A-2D after forming source/drain regions 18 on portions of each semiconductor material portion 14P not protected by a sacrificial insulator structure 16. It is noted that the source/drain region on one side of the sacrificial insulator structure 16 will function as the source region of a functional gate structure (to be subsequently formed), and the source/drain region on another side of the sacrificial insulator structure 16 will function as the drain region of a functional gate structure (to be subsequently formed). In some embodiments, and as shown, merging of source/drain regions 18 located on at least one side of each sacrificial insulator structure 16 may occur. In other embodiments (not shown), the source/drain regions 18 that are located on at least one side of each sacrificial insulator structure 16 are not merged. In some embodiments, and as shown, each source/drain region 18 has a faceted surface. In some embodiments, each source/drain region 18 has a non-faceted surface.

The source/drain regions 18 comprise a semiconductor material that includes either an n-type dopant or a p-type dopant. The semiconductor material that provides the source/drain regions 18 may comprise one of the semiconductor materials mentioned above in providing each semiconductor material portion 14P. In one embodiment of the present application, the semiconductor material that provides the source/drain regions 18 comprises a same semiconductor material as each semiconductor material portion 14P. In one example, the source/drain regions 18 and each semiconductor material portion 14P comprise silicon. In another embodiment of the present application, the semiconductor material that provides the source/drain regions 18 comprises a different semiconductor material than each semiconductor material portion 14P. In one example, each source/drain region 18 comprises a silicon germanium alloy, while each semiconductor material portion 14P comprises silicon.

As used throughout the present application, "p-type" refers to the addition of impurities to an intrinsic semiconductor material that creates deficiencies of valence electrons. In one embodiment, the p-type dopant is present in a concentration ranging from 1E17 atoms/cm$^3$ to 1E19 atoms/cm$^3$. In another embodiment, the p-type dopant is present in a concentration ranging from 1E18 atoms/cm$^3$ to 1E21 atoms/cm$^3$. As used throughout the present application, "n-type" refers to the addition of impurities that contributes free electrons to an intrinsic semiconductor. In one embodiment, the n-type dopant is present in a concentration ranging from 1E17 atoms/cm$^3$ to 1E19 atoms/cm$^3$. In another embodiment, the n-type dopant is present in a concentration ranging from 1E18 atoms/cm$^3$ to 1E21 atoms/cm$^3$.

Each source/drain region 18 can be formed utilizing an epitaxial growth (i.e., epitaxial deposition) process. Prior to epitaxial growth, the protective dielectric coating 15 can be removed from portions of each semiconductor material portion 14P that are not covered by the sacrificial insulator structure 16. The removal of the protective dielectric coating 15 comprises an etching process that is selective in removing the protective dielectric coating 15 from portions of each semiconductor material portion 14P not covered by the sacrificial insulator structure 16.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. Thus, and in the present application, each source/drain region 18 has an epitaxial relationship, i.e., same crystal orientation, as that of an exposed growth surface of the semiconductor material portion 14P.

Examples of various epitaxial growth process that are suitable for use in forming source/drain regions 18 of the present application include, e.g., metalorgano chemical vapor deposition (MOCVD), rapid thermal chemical vapor deposition (RTCVD), low-energy plasma deposition (LEPD), ultra-high vacuum chemical vapor deposition (UHVCVD), atmospheric pressure chemical vapor deposition (APCVD) or molecular beam epitaxy (MBE). The temperature for epitaxial deposition process for forming the source/drain regions 18 typically ranges from 550° C. to 900° C. Although higher temperature typically results in faster deposition, the faster deposition may result in crystal defects and film cracking.

A number of different source gases which are well known to those skilled in the art may be used for the deposition of the source/drain regions 18. Carrier gases like hydrogen, nitrogen, helium and argon can be used during the epitaxial growth process. In some embodiments, dopants can be present during the epitaxial growth of the semiconductor material that provides each source/drain region 18. In other embodiments, no dopant is present during the epitaxial deposition of the semiconductor material that provides the source/drain regions 18. Dopants (i.e., impurities) can be introduced after the epitaxial growth process utilizing a gas phase doping process. Block mask technology may be used to form the source/drain regions 18. Activation of the dopant may be performed utilizing any conventional anneal process which can be performed anytime after forming the doped semiconductor material that provides each source/drain region 18.

Referring now to FIGS. 4A-4D, there are illustrated various views of the exemplary semiconductor structure of FIGS. 3A-3D after forming a planarizing dielectric material 20 having a topmost surface that is coplanar with a topmost surface of each sacrificial insulator structure 16. In accordance with the present application, planarizing dielectric material 20 comprises a dielectric material that differs from that of each sacrificial insulator structure 16.

In some embodiments, the planarizing dielectric material 20 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the planarizing dielectric material 20. The use of a self-planarizing dielectric material as planarizing dielectric material 20 may avoid the need to perform a subsequent planarizing step.

In one embodiment, the planarizing dielectric material 20 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as planarizing dielectric material 20, a planarization process or an etch back process follows the deposition of the planarizing dielectric material 20. The thickness of the planarizing dielectric material 20 that can be employed in the present application may vary depending on the type of dielectric material employed as well as the method that was employed in forming the same. In one embodiment, the planarizing dielectric material 20 has a thickness from 80 nm to 500 nm. Other thicknesses that are greater or lesser than the range provided above can also be used for the planarizing dielectric material 20.

Referring now to FIGS. 5A-5D, there are illustrated various views of the exemplary semiconductor structure of FIGS. 4A-4D after replacing each sacrificial insulator structure 16 with a functional gate structure 22. By "functional gate structure" it is meant a permanent gate structure used to control output current (i.e., flow of carriers in the channel) of a semiconducting device through electrical or magnetic fields. Each functional gate structure 22 that is formed includes a gate material stack of, from bottom to top, a gate dielectric portion 24P, a gate conductor portion 26P and a gate cap portion 28P. In some embodiments, the gate cap portion 28P can be omitted. In some embodiments (and as shown), and prior to forming the functional gate structure 22, the portion of the protective dielectric coating 15 that is present directly beneath the sacrificial insulator structure 16 can be removed utilizing a selective etch. In other embodiments (not shown), the protective dielectric coating 15 located directly beneath the sacrificial insulator structure 16 may remain.

Each functional gate structure 22 is formed by first removing the sacrificial insulator structure 16. Each sacrificial insulator structure 16 can be removed utilizing an etch that is selective for removing the material of each sacrificial insulator structure 16 relative to the planarizing dielectric material 20. In one example, reactive ion etching can be used in removing each sacrificial insulator structure 16. The removal of each sacrificial insulator structure 16 forms a gate cavity (not shown) in which each functional gate structure 22 is formed.

As mentioned above, each functional gate 22 includes a gate dielectric portion 24P which is U-shaped. By "U-shaped", it is meant the dielectric portion includes a horizontal base portion and a vertical sidewall portion that extends upward from the horizontal base portion. Each gate dielectric portion 24P comprises a dielectric material. The gate dielectric material that provides each gate dielectric portion 24P can be an oxide, nitride, and/or oxynitride. In one example, the gate dielectric material that provides each gate dielectric portion 24P can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as each gate dielectric portion 24P.

The gate dielectric material used in providing each gate dielectric portion 24P can be formed by any deposition process including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming the gate dielectric material of each gate dielectric portion 24P. In some embodiments, each gate dielectric portion 24P comprises a same gate dielectric material. In other embodiments, a first set of gate dielectric portions may comprise a first gate dielectric material, while a second set of gate dielectric portions may comprise a second gate dielectric material that differs in composition from the first gate dielectric material. When a different gate dielectric material is used for the gate dielectric portions, block mask technology can be used. In one embodiment of the present application, the gate dielectric material used in providing each gate dielectric portion 24P can have a thickness in a range from 1 nm to 10 nm. Other thicknesses that are lesser than, or greater than, the aforementioned thickness range can also be employed for the gate dielectric material.

Each gate conductor portion 26P comprises a gate conductor material. The gate conductor material used in providing each gate conductor portion 26P can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, each gate conductor portion 26P may comprise an nFET gate metal. In other embodiments, each gate conductor portion 26P may comprise a pFET gate metal. In yet other embodiments, some of the gate conductor portions comprise an nFET gate metal, while other gate conductor portions comprise a pFET gate metal.

The gate conductor material used in providing each gate conductor portion 26P can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing each gate conductor portion 26P has a thickness from 1 nm to 100 nm. Other thicknesses that are lesser than, or greater than, the aforementioned thickness range can also be employed for the gate conductor material used in providing each gate conductor portion 26P.

Each gate cap portion 28P comprises a gate cap material that comprises a dielectric material that is different from the dielectric material that provides planarizing dielectric material 20. In one embodiment, each gate cap portion 28P comprises silicon nitride or silicon oxynitride. The dielectric material that provides each gate cap portion 28P can be formed utilizing a conventional deposition process such as, for example, chemical vapor deposition or plasma enhanced chemical vapor deposition. The dielectric material that provides each gate cap portion 28P can have a thickness from 5 nm to 20 nm. Other thicknesses that are lesser than, or greater than, the aforementioned thickness range can also be employed as the thickness of the dielectric material that provides each gate cap portion 28P.

After providing the gate dielectric material, the gate conductor material and, optionally, the dielectric material that provides the gate cap portions 28P, the resultant material stack is patterned by lithography and etching to provide each functional gate structure 22.

Figure 6A:
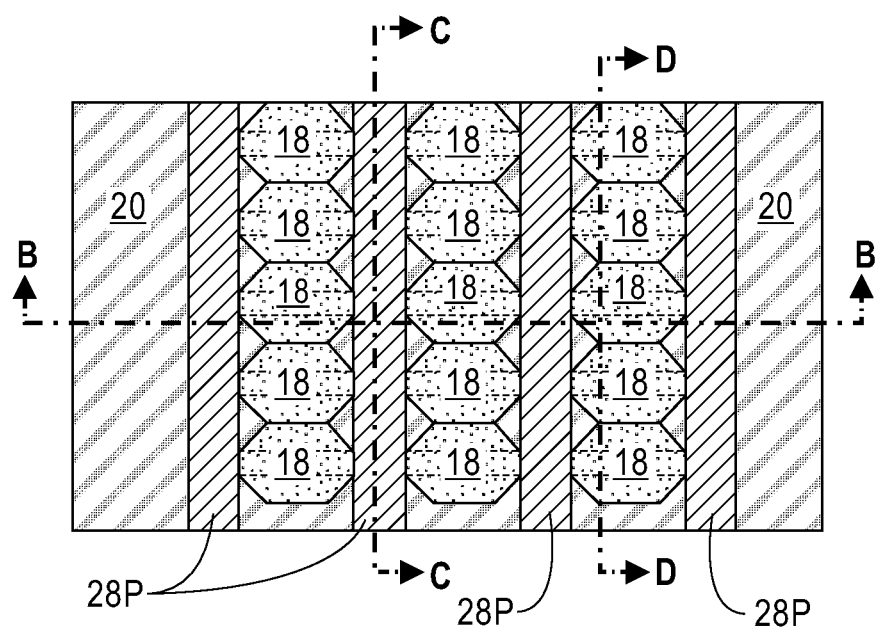
FIG. 6A is a top down view of the exemplary semiconductor structure of FIG. 5A after exposing some of the source/drain regions.
Figure 6B:
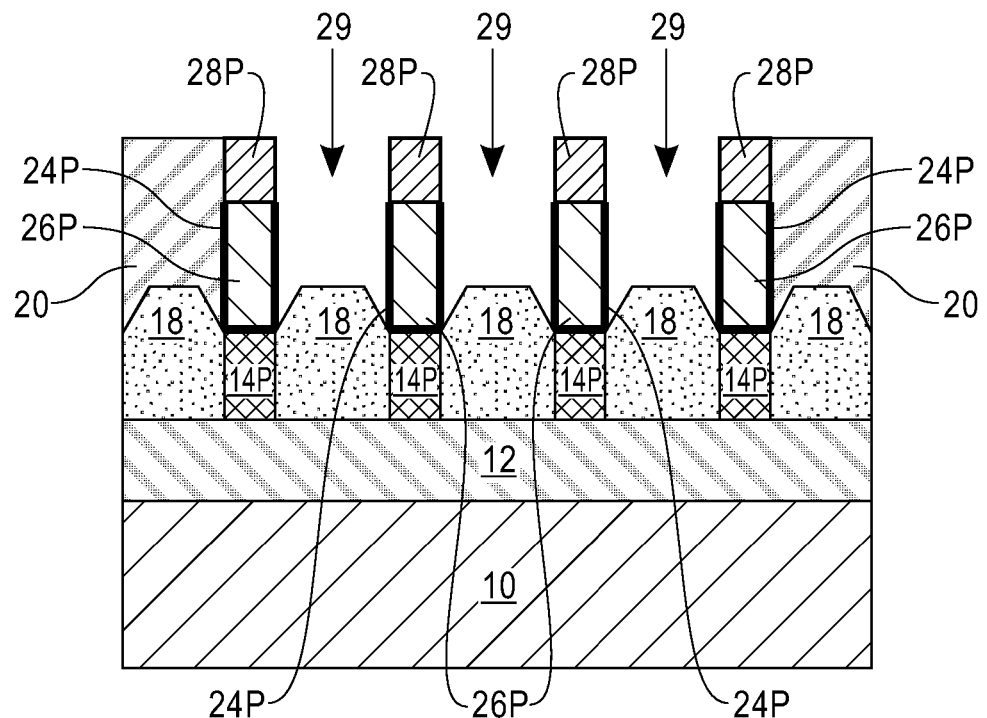
FIG. 6B is a vertical cross sectional view of the exemplary semiconductor structure along vertical plane B-B of FIG. 6A.
Figure 6C:
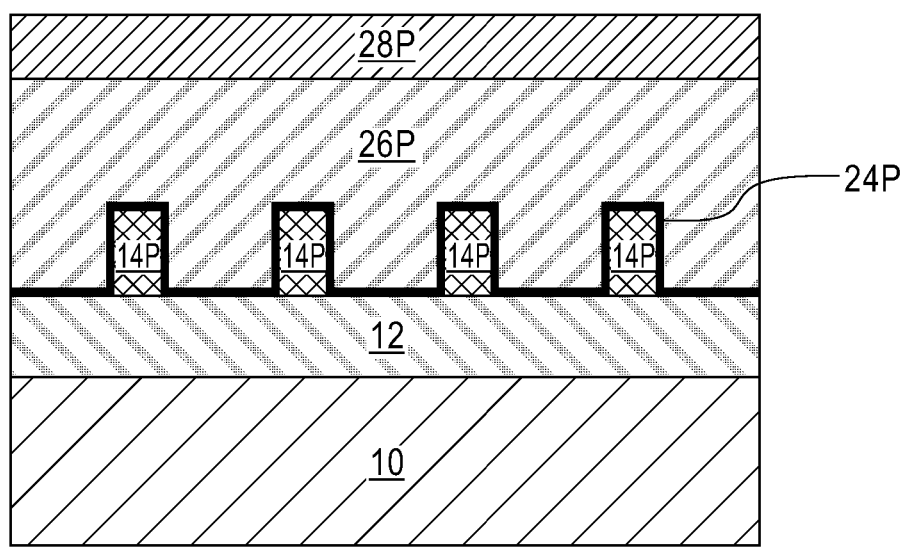
FIG. 6C is a vertical cross sectional view of the exemplary semiconductor structure along vertical plane C-C of FIG. 6A.
Figure 6D:
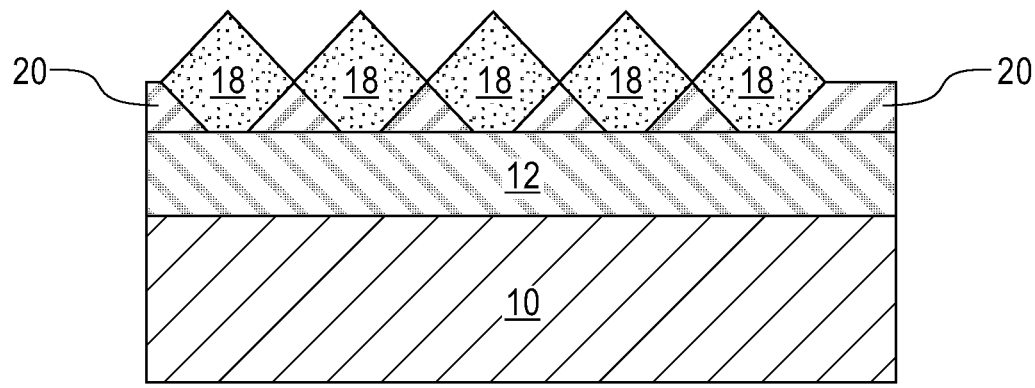
FIG. 6D is a vertical cross sectional view of the exemplary semiconductor structure along vertical plane D-D of FIG. 6A.
Figure 7A:
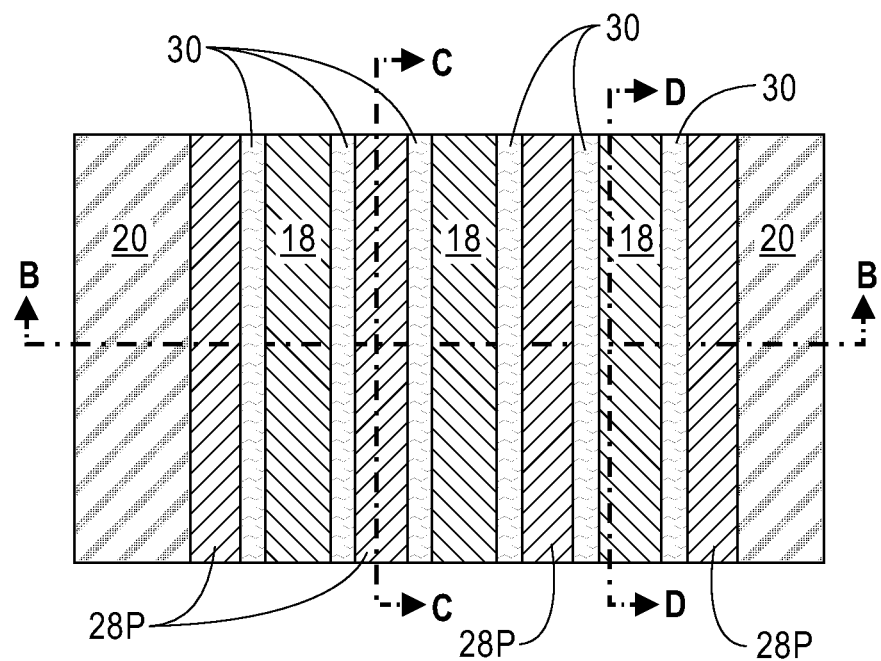
FIG. 7A is a top down view of the exemplary semiconductor structure of FIG. 6A after forming a sacrificial contact material portion.
Figure 7B:
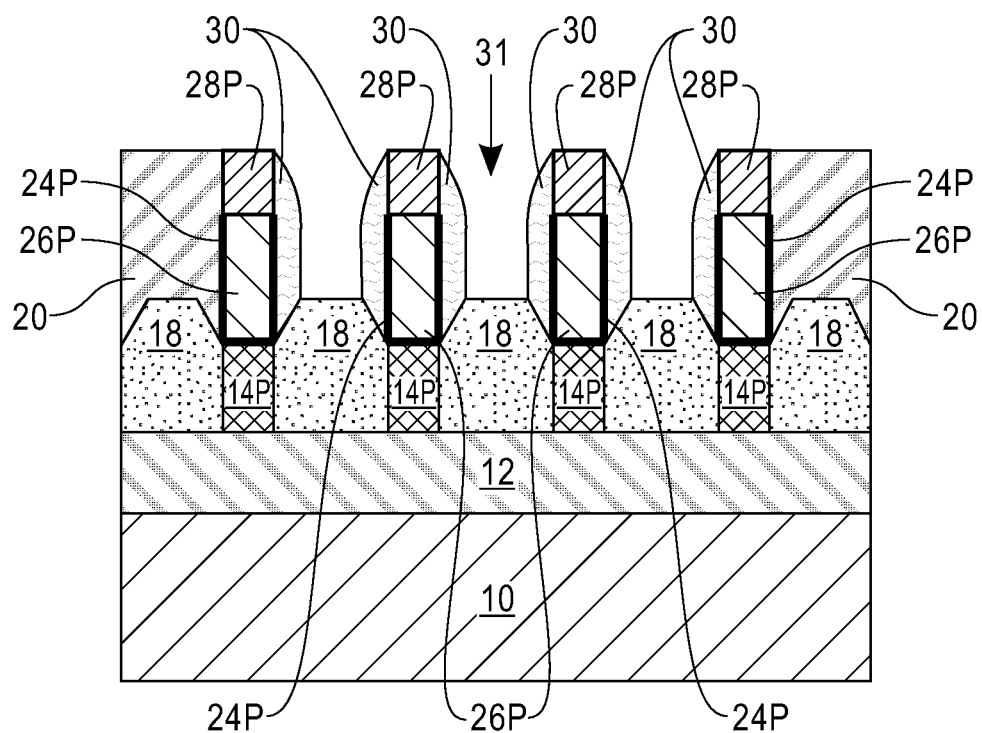
FIG. 7B is a vertical cross sectional view of the exemplary semiconductor structure along vertical plane B-B of FIG. 7A.
Figure 7C:
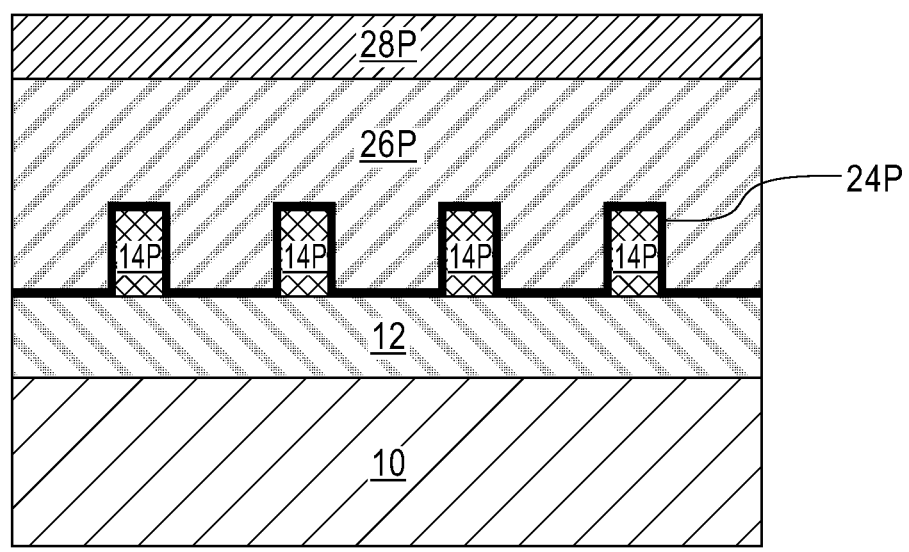
FIG. 7C is a vertical cross sectional view of the exemplary semiconductor structure along vertical plane C-C of FIG. 7A.
Figure 7D:
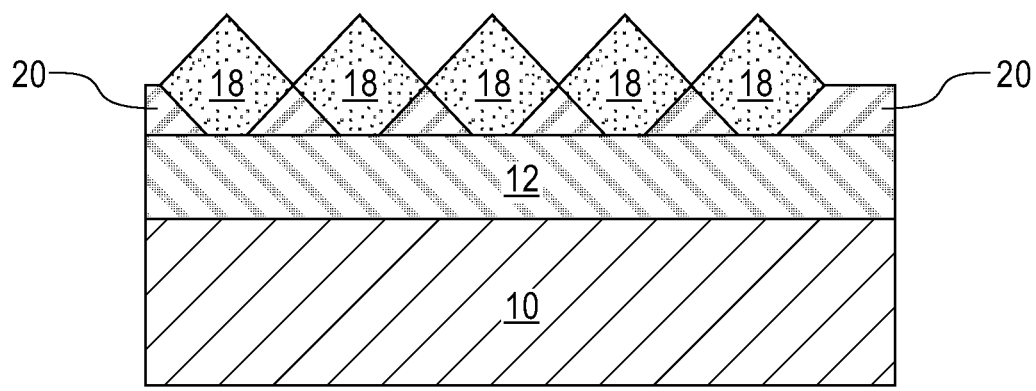
FIG. 7D is a vertical cross sectional view of the exemplary semiconductor structure along vertical plane D-D of FIG. 7A.
Figure 8A:
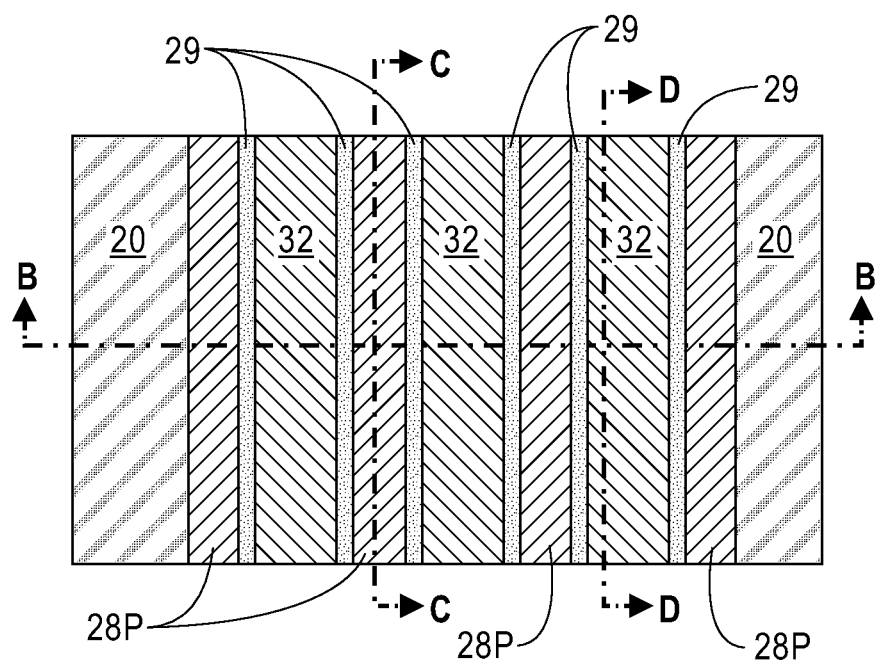
FIG. 8A is a top down view of the exemplary semiconductor structure of FIG. 7A after forming a contact structure.
Figure 8B:
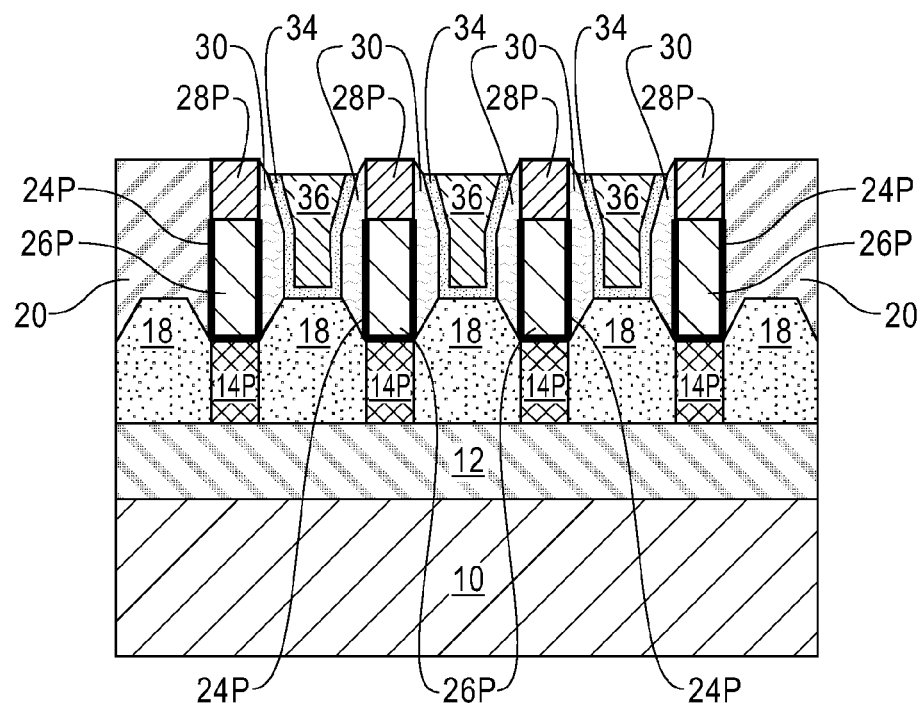
FIG. 8B is a vertical cross sectional view of the exemplary semiconductor structure along vertical plane B-B of FIG. 8A.
Figure 8C:
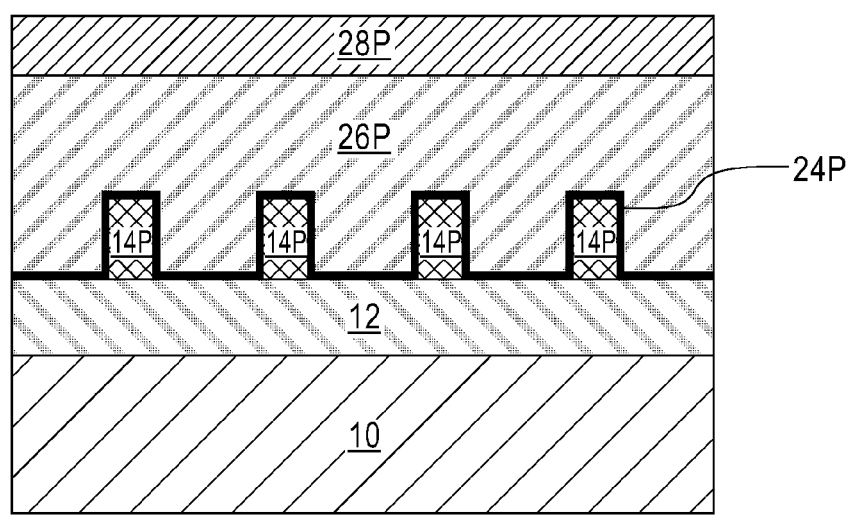
FIG. 8C is a vertical cross sectional view of the exemplary semiconductor structure along vertical plane C-C of FIG. 8A.
Figure 8D:
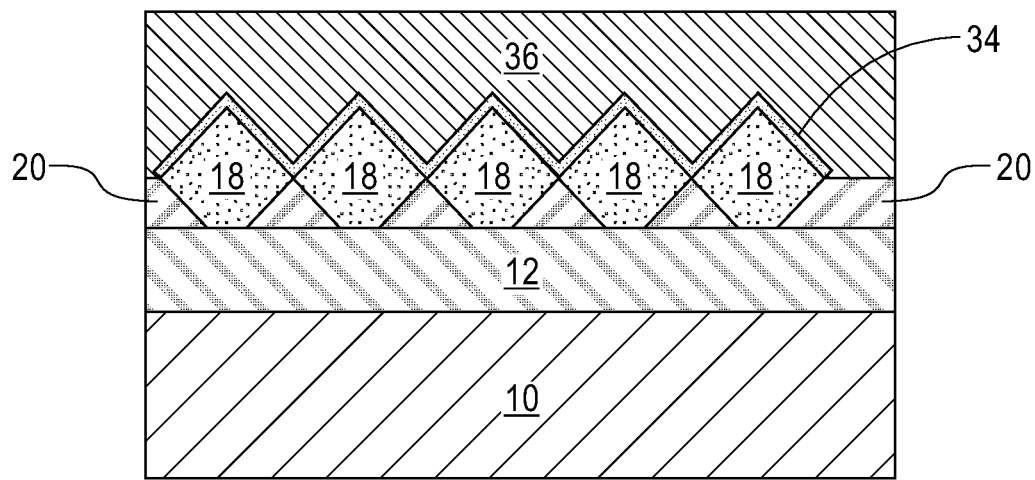
FIG. 8D is a vertical cross sectional view of the exemplary semiconductor structure along vertical plane D-D of FIG. 8A.
Figure 9A:
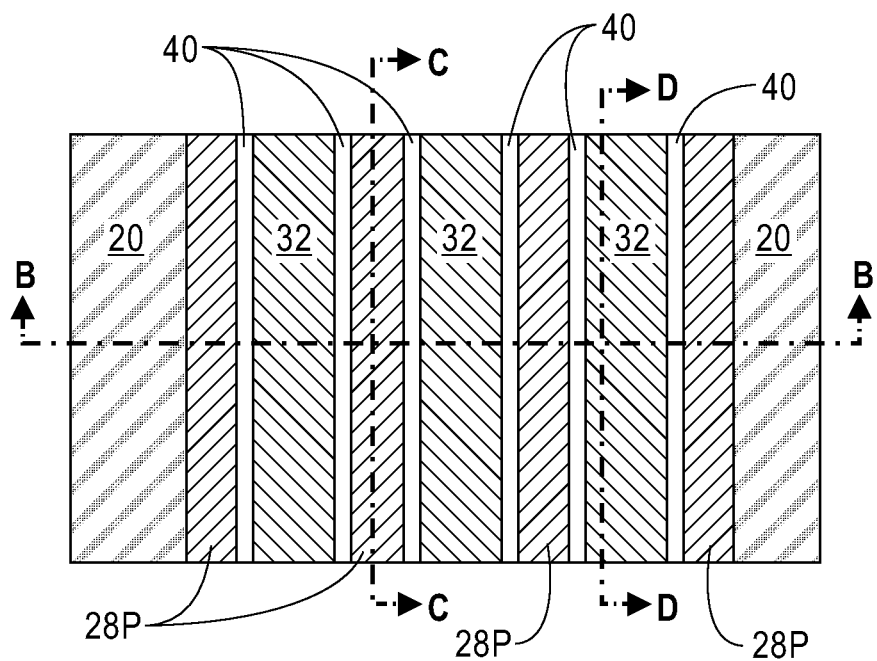
FIG. 9A is a top down view of the exemplary semiconductor structure of FIG. 8A after removing the sacrificial contact material portion to provide an air gap.
Figure 9B:
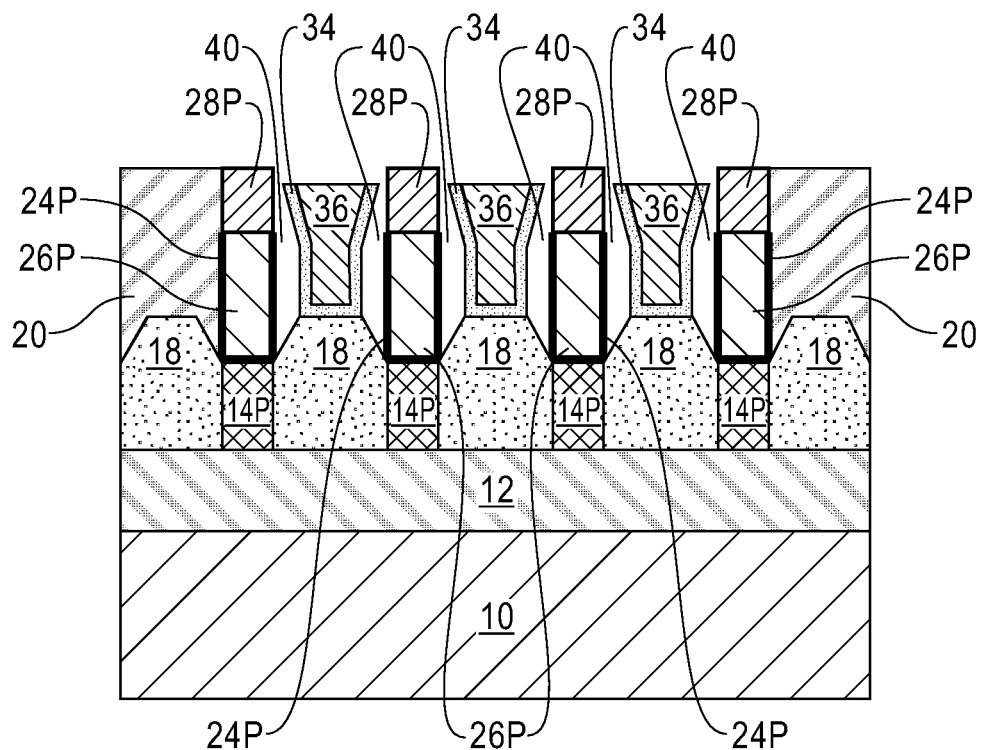
FIG. 9B is a vertical cross sectional view of the exemplary semiconductor structure along vertical plane B-B of FIG. 9A.
Figure 9C:
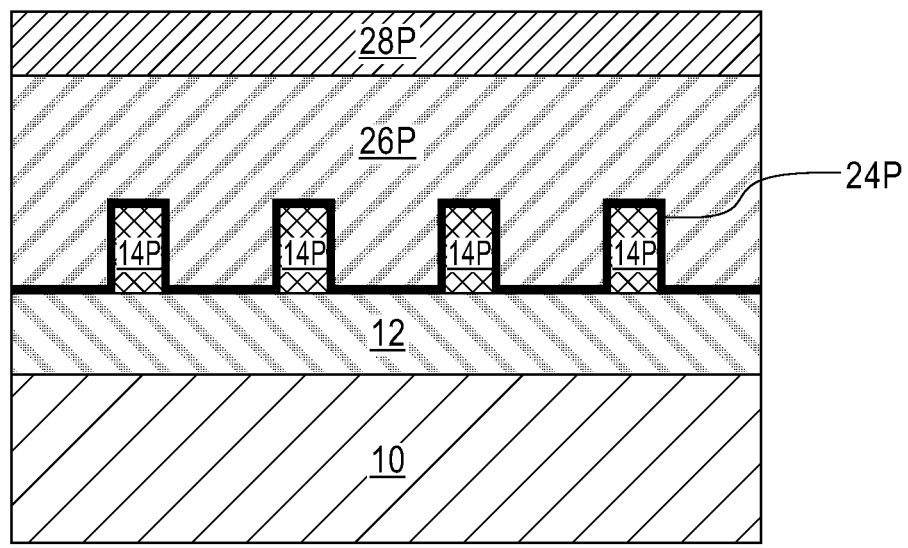
FIG. 9C is a vertical cross sectional view of the exemplary semiconductor structure along vertical plane C-C of FIG. 9A.
Figure 9D:
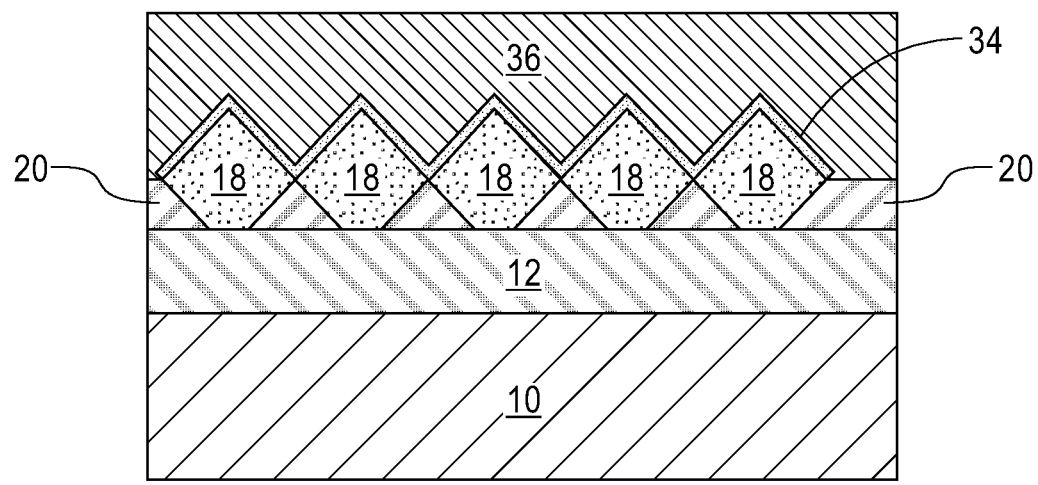
FIG. 9D is a vertical cross sectional view of the exemplary semiconductor structure along vertical plane D-D of FIG. 9A.
Figure 10A:
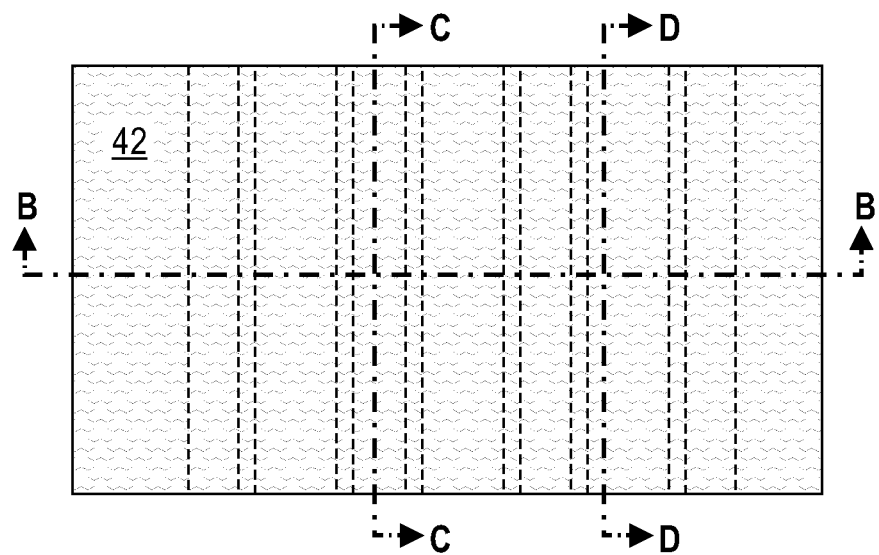
FIG. 10A is a top down view of the exemplary semiconductor structure of FIG. 9A after forming a non-conformal dielectric material sealing the air gap and providing a middle-of-the-line air gap contact.
Figure 10B:
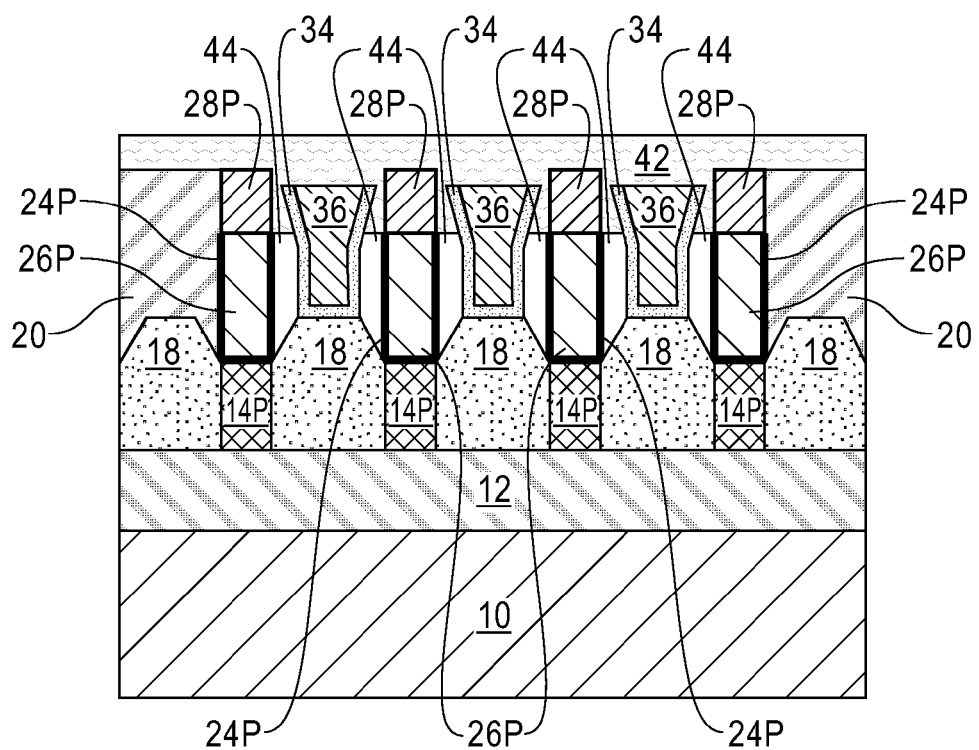
FIG. 10B is a vertical cross sectional view of the exemplary semiconductor structure along vertical plane B-B of FIG. 10A.
Figure 10C:
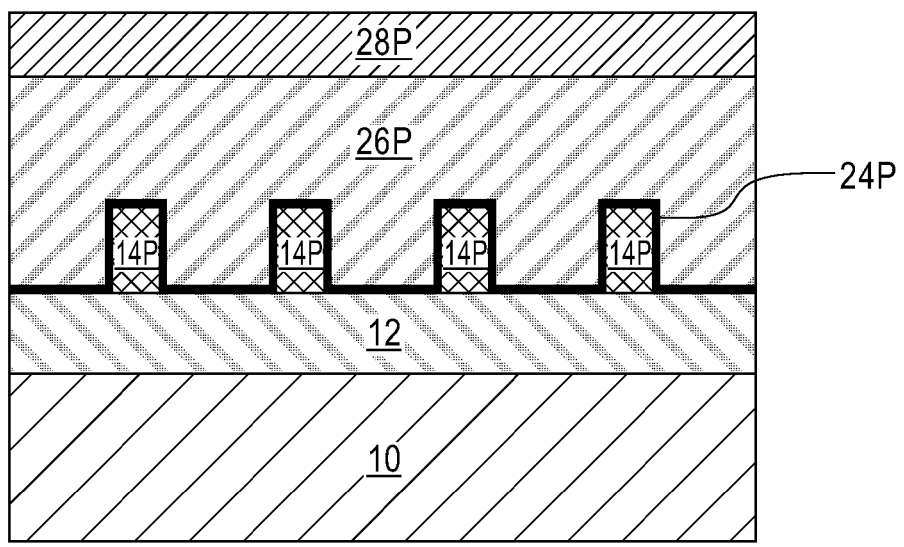
FIG. 10C is a vertical cross sectional view of the exemplary semiconductor structure along vertical plane C-C of FIG. 10A.
Figure 10D:
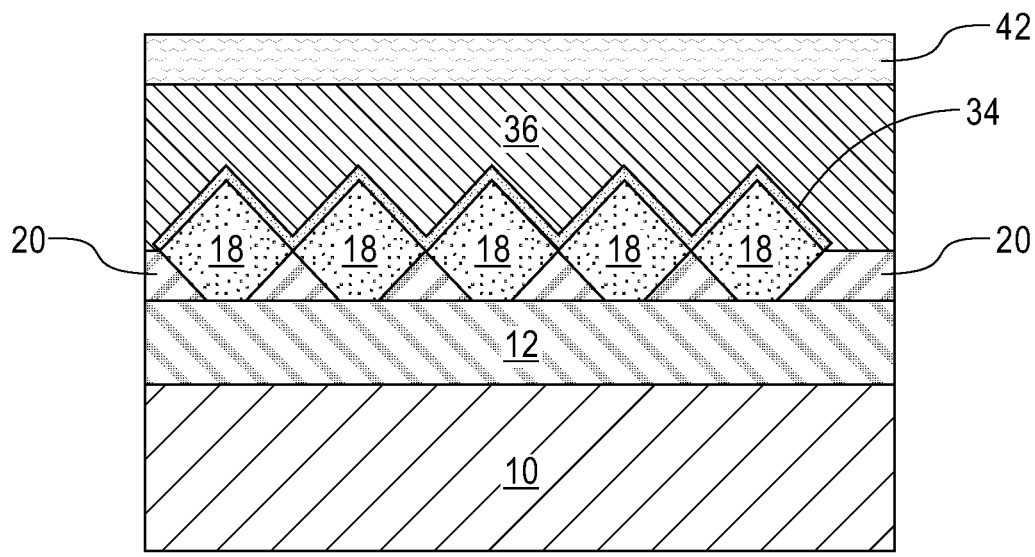
FIG. 10D is a vertical cross sectional view of the exemplary semiconductor structure along vertical plane D-D of FIG. 10A.

Referring now to FIGS. 6A-6D, there are illustrated various views of the exemplary semiconductor structure of FIGS. 5A-5D after exposing at least some of the source/drain regions 18. The exposing of the source/drain regions 18 includes either a self-aligned process using the gate stack 28P/26P/24P as self-aligned mask, or by forming a patterned photoresist material (not shown) atop portions of the planarizing dielectric material 20. An etch is then used to selectively remove the exposed portions of the planarizing dielectric material 20 that are present atop some of the source/drain regions 18. After the etch, the patterned photoresist is removed from the structure utilizing a conventional resist stripping process such as, for example, ashing. As is shown in FIG. 6B, contact openings 29 are formed above the exposed source/drain regions 18 and between some of the functional gate structures 22.

Referring now to FIGS. 7A-7D, there are illustrated various views of the exemplary semiconductor structure of FIGS. 6A-6D after forming a sacrificial contact material portion 30. As is shown, the sacrificial contact material portion 30 does not completely fill the volume of the contact opening 29. Instead, the sacrificial contact material portion 30 is formed on exposed vertical sidewall surfaces of each functional gate structure 22. As is further shown, each contact opening 29 includes a pair of sacrificial contact material portions 30. A bottommost surface of each sacrificial contact material portion 30 forms on a surface of each exposed source/drain region 18. A contact gap 31 remains between each sacrificial contact material portion 30 that is formed within contact opening 29.

The sacrificial contact material portion 30 comprises any material that can be selectively removed relative to the planarizing dielectric material 20, each gate cap portion 28P and the materials of the contact structure (to be subsequently formed). In one example, amorphous carbon is used as the material for providing each sacrificial contact material portion 30. The sacrificial contact material portion 30 can be formed by deposition and etching.

Referring now to FIGS. 8A-8D, there are illustrated various views of the exemplary semiconductor structure of FIG. 7A-7D after forming a contact structure 32 within contact gap 31. Each contact structure 32 includes a contact metal liner 34 and a contact metal portion 36. The contact metal liner 34 lines the exposed surfaces within each contact gap 31. The contact metal portion 34 is located within a remaining volume of the contact gap 31 and contacts an exposed surface of the contact metal liner 34.

The contact metal liner 34 includes a diffusion barrier material such as, for example, Ta, TaN, Ti, TiN, Ru, RuN, RuTa, RuTaN, IrTa, IrTaN, W, WN or any other material that can serve as a barrier to prevent a conductive material from diffusing there through. In one example, the contact metal liner 34 may include a stack of Ti/TiN. In one embodiment of the present application, the diffusion barrier material that forms the contact metal liner 34 has a thickness from 2 nm to 25 nm. Other thicknesses that are lesser than, or greater than, the aforementioned thickness range can also be employed for the contact metal liner 34. The diffusion barrier material that forms the contact metal liner 34 may be formed by a deposition process. Examples of deposition processes that can be used in forming the diffusion barrier material include, but are not limited to, chemical vapor deposition, plasma enhanced chemical vapor deposition, physical vapor deposition, sputtering or plating.

After forming the diffusion barrier material that provides the contact metal liner 34, a contact metal such as, for example, W, Al, Cu or alloys thereof, is formed atop the diffusion barrier material. The contact metal can be formed utilizing one of the deposition processes mentioned above in forming the gate conductor material for each functional gate structure. After forming the contact metal, a planarization process can be used to provide the contact structure 30 including the contact metal liner 34 (i.e., a remaining portion of the diffusion barrier material) and a contact metal structure 36 (i.e., a remaining portion of the contact metal). After planarization, the contact metal liner 34 and the contact metal structure 36 have topmost surfaces that are coplanar with each other.

Referring now to FIGS. 9A-9D, there are illustrated various views of the exemplary semiconductor structure of FIGS. 8A-8D after removing the sacrificial contact material portion 30 to provide an air gap 40. The removal of the sacrificial contact material portion 30 can be performed utilizing any selective etching process that removes the material of the sacrificial contact material portion 30 relative to the materials that provide planarizing dielectric material 20, each gate cap portion 28P and each contact structure 32. In one example, and when amorphous carbon is employed as the sacrificial contact material portion 30, an oxygen ash process can be used.

The air gap 40 that is provided occupies the volume of the removed sacrificial contact material portion 30. Each air gap 40 exposes a surface of each gate dielectric portion 24P, each gate cap portion 28P, source/drain regions 18 and the contact metal liner 34 of each contact structure 32.

Referring now to FIGS. 10A-10D, there are illustrated various views of the exemplary semiconductor structure of FIGS. 9A-9D after forming a non-conformal dielectric material 42 sealing the air gap 40 and providing middle-of-the line air gap contact 44. By "non-conformal" it is meant a material having different thicknesses on a vertical and horizontal surface.

The non-conformal dielectric material 42 may comprise any dielectric material. In one embodiment, the non-conformal dielectric material 42 and each gate cap portion 28P comprise a same dielectric material. In one example, the non-conformal dielectric material 42 and each gate cap portion 28P comprise silicon nitride. In another embodiment, the non-conformal dielectric material 42 and each gate cap portion 28P comprise a different dielectric material. The non-conformal dielectric material 42 can be formed utilizing a non-conformal deposition process.

The middle-of-the line air gap contact 44 is present along a vertical surface of each gate dielectric portion 24P and a vertical surface of each contact metal liner 34 of each contact structure 32. The middle-of-the line air gap contact 44 is also located above a portion of some of the source/drain regions 18 which were selected above exposed above. Middle-of-the line air gap contact 44 has a topmost surface that is located beneath a topmost surface of the contact structure 32. Also, middle-of-the line air gap contact 44 partially occupies the volume of each removed sacrificial contact material portion 30.

FIGS. 10A-10D illustrate a semiconductor structure in accordance with the present application. As is shown, the semiconductor structure includes a functional gate structure (second from the left, for example) located on a surface of a semiconductor material portion 14P and including a U-shaped gate dielectric portion 24P and a gate conductor portion 26P. A source region (18 on left hand side of the aforementioned functional gate structure, for example) is located on one side of the functional gate structure 22, and a drain region (18 on right hand side of the aforementioned functional gate structure) is located on another side of the functional gate structure. The source region and drain region both have a topmost surface that is above a topmost surface of the semiconductor material portion 14P and another surface that touches a portion of the U-shaped gate dielectric 24P. A contact structure 32 is located on the topmost surface of the at least one of the source region and the drain region (both in the case of exemplified functional gate structure). A middle-of-the-line air gap contact 44 is located between the contact structure 32 and the functional gate structure and above at least one of the source region and the drain region, wherein the middle-of-the-line air gap contact 44 is sealed by a portion of a conformal dielectric material 42.

Figure 11:
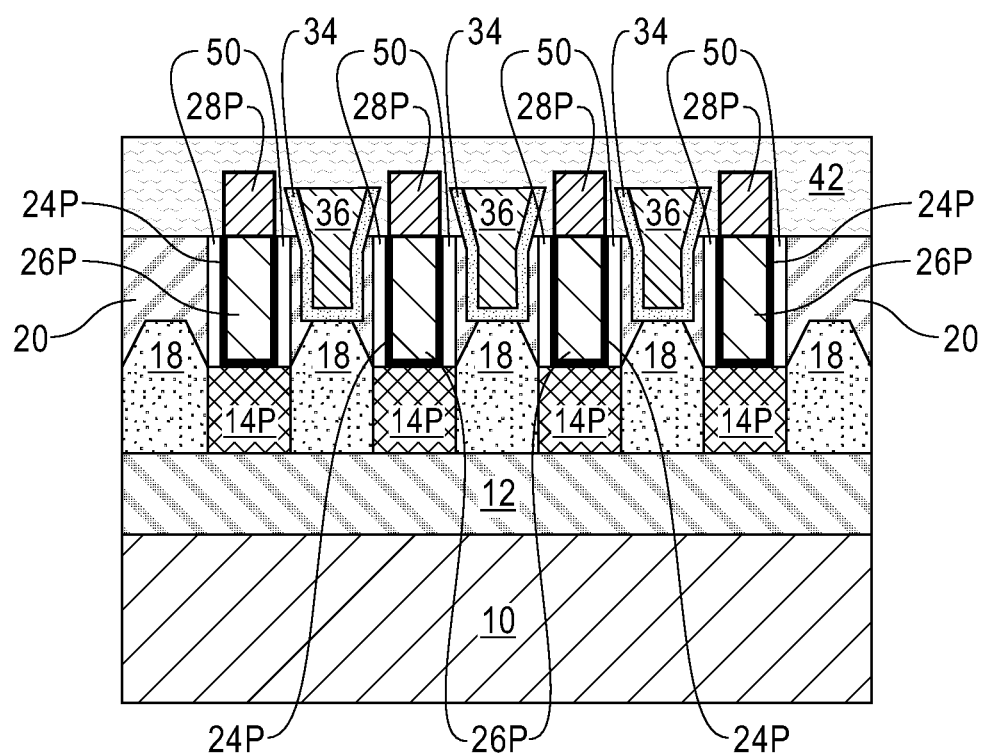
FIG. 11 is a cross sectional view of a prior art semiconductor structure in which air gap spacers are made utilizing a conventional processing flow.

Referring now to FIG. 11, there is illustrated a prior art semiconductor structure in which air gap spacers 50 are made utilizing a conventional processing flow. In FIG. 11, elements that are equivalent to those discussed above include like reference numerals. In the prior art structure, the source/drain regions 18 do not touch upon any portion of the U-shaped gate dielectric portion 24P. In the prior art structure, air gap spacers 50 are present along the vertical sidewalls of the functional gate structure. The air gap spacers 50 are formed by first forming a sacrificial gate spacer prior to formation of the source/drain regions 18 and then removing the sacrificial gate spacer after source/drain formation.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
   providing a sacrificial insulator structure on a surface of a semiconductor material portion;
   epitaxially growing a source region on one side of the sacrificial insulator structure and a drain region on another side of the sacrificial insulator structure, wherein both said source region and said drain region have a topmost surface that is above a topmost surface of said semiconductor material portion;
   replacing said sacrificial insulator structure with a functional gate structure, said functional gate structure comprising a U-shaped gate dielectric portion and a gate conductor portion, and wherein another surface of both said source region and said drain regions contacts a portion of said U-shaped gate dielectric portion;
   forming a sacrificial contact material portion within a contact opening and along a vertical sidewall of said functional gate structure;
   forming a contact structure on said topmost surface of at least one of said source region and said drain region;
   removing said sacrificial contact material portion; and
   forming a middle-of the-line air gap contact within a portion of a volume previously occupied by said sacrificial contact material portion.

2. The method of claim 1, wherein said semiconductor material portion is a semiconductor fin, and said semiconductor fin is formed by patterning a topmost semiconductor material layer of a semiconductor substrate.

3. The method of claim 1, further comprising forming a planarizing dielectric material prior to replacing said sacrificial insulator structure, said planarizing dielectric material having a topmost surface that is coplanar with a topmost surface of said sacrificial insulator structure.

4. The method of claim 3, wherein said functional gate structure comprises a dielectric cap portion located on said gate conductor portion, said dielectric cap portion having a topmost surface coplanar with said topmost surface of said planarizing dielectric material.

5. The method of claim 3, wherein said contact opening is formed by removing said planarizing dielectric material that is located above at least one of said source region and said drain region.

6. The method of claim 5, wherein said removing said planarizing dielectric material comprises lithography and etching.

7. The method of claim 1, wherein said forming said sacrificial contact material portion comprises depositing amorphous carbon and etching said amorphous carbon.

8. The method of claim 1, wherein said forming said contact structure comprises providing a contact metal portion on a surface of a contact metal liner.

9. The method of claim 1, wherein said removing said sacrificial contact material portion provides an air gap.

10. The method of claim 9, wherein said forming said middle-of the-line air gap contact comprises sealing said air gap by forming a conformal dielectric material spanning atop said air gap and across both said functional gate structure and said contact structure.

11. A method of forming a semiconductor structure, said method comprising:
- providing a sacrificial insulator structure on a surface of a semiconductor material portion;
- epitaxially growing a source region on one side of the sacrificial insulator structure and a drain region on another side of the sacrificial insulator structure, wherein both said source region and said drain region have a topmost surface that is above a topmost surface of said semiconductor material portion;
- forming a planarizing dielectric material laterally surrounding said sacrificial insulator structure and having a topmost surface that is coplanar with a topmost surface of said sacrificial insulator structure;
- replacing said sacrificial insulator structure with a functional gate structure;
- forming a sacrificial contact material portion within a contact opening and along a vertical sidewall of said functional gate structure;
- forming a contact structure on said topmost surface of at least one of said source region and said drain region;
- removing said sacrificial contact material portion to provide an air gap; and
- sealing said air gap, wherein said sealing provides a middle-of the-line air gap contact within a portion of a volume previously occupied by said sacrificial contact material portion.

12. The method of claim 11, wherein said semiconductor material portion is a semiconductor fin, and said semiconductor fin is formed by patterning a topmost semiconductor material layer of a semiconductor substrate.

13. The method of claim 11, wherein said functional gate structure comprises a U-shaped gate dielectric portion and a gate conductor portion, and wherein another surface of both said source region and said drain regions contacts a portion of said U-shaped gate dielectric portion.

14. The method of claim 13, wherein said functional gate structure comprises a dielectric cap portion located on said gate conductor portion, said dielectric cap portion having a topmost surface coplanar with said topmost surface of said planarizing dielectric material.

15. The method of claim 11, wherein said contact opening is formed by removing said planarizing dielectric material that is located above at least one of said source region and said drain region.

16. The method of claim 15, wherein said removing said planarizing dielectric material comprises lithography and etching.

17. The method of claim 11, wherein said forming said sacrificial contact material portion comprises depositing amorphous carbon and etching said amorphous carbon.

18. The method of claim 11, wherein said forming said contact structure comprises providing a contact metal portion on a surface of a contact metal liner.

19. The method of claim 11, wherein said sealing said air gap comprises forming a conformal dielectric material spanning atop said air gap and across both said functional gate structure and said contact structure.

* * * * *